US012626741B2

(12) United States Patent
Lee et al.

(10) Patent No.: US 12,626,741 B2
(45) Date of Patent: May 12, 2026

(54) WRITE DRIVER WITH SELECTIVE VOLTAGE SWING FOR MEMORY DEVICES

(71) Applicant: Samsung Electronics Co., Ltd., Suwon-si (KR)

(72) Inventors: Jaeyoul Lee, Suwon-si (KR); Sanghoon Jung, Suwon-si (KR); Jinyong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 18/679,691

(22) Filed: May 31, 2024

(65) Prior Publication Data

US 2025/0182813 A1      Jun. 5, 2025

(30) Foreign Application Priority Data

Dec. 1, 2023    (KR) ........................ 10-2023-0172037

(51) Int. Cl.

| | |
|---|---|
| *G11C 8/08* | (2006.01) |
| *G11C 7/10* | (2006.01) |
| *G11C 11/4091* | (2006.01) |
| *G11C 11/4096* | (2006.01) |
| *H03K 19/017* | (2006.01) |

(52) U.S. Cl.
CPC .............. *G11C 8/08* (2013.01); *G11C 7/1096* (2013.01); *G11C 11/4091* (2013.01); *G11C 11/4096* (2013.01); *H03K 19/01721* (2013.01)

(58) Field of Classification Search
CPC .... G11C 8/08; G11C 7/12; G11C 7/06; G11C 7/1084; G11C 11/4096; G11C 11/4085; G11C 11/4091; G11C 7/1096; G11C 11/2257; G11C 11/2259; H03K 19/01721
See application file for complete search history.

(56) References Cited

U.S. PATENT DOCUMENTS

| | | | |
|---|---|---|---|
| 5,936,896 A | 8/1999 | Cho et al. | |
| 6,574,151 B2 * | 6/2003 | Park ......................... | G11C 7/06 |
| | | | 365/189.11 |
| 7,688,120 B2 | 3/2010 | Kim | |

(Continued)

FOREIGN PATENT DOCUMENTS

| | | |
|---|---|---|
| KR | 10-0238247 B1 | 1/2000 |
| KR | 10-2000-0061689 A | 10/2000 |

(Continued)

*Primary Examiner* — B. James Peikari
(74) *Attorney, Agent, or Firm* — Muir Patent Law, PLLC

(57) ABSTRACT

A write driver for performing a write operation on a semiconductor memory device includes a first pull-up circuit, a second pull-up circuit and a pull-down circuit. The first pull-up circuit is connected to an output terminal, and pulls up the output terminal based on a power supply voltage and a first pull-up control signal. The second pull-up circuit is connected to the output terminal, and pulls up the output terminal based on the power supply voltage and a second pull-up control signal. The pull-down circuit is connected to the output terminal, and pulls down the output terminal based on a ground voltage and a pull-down control signal. A first pull-up operation for pulling up the output terminal using the first pull-up circuit, and a second pull-up operation for pulling up the output terminal using the second pull-up circuit are selectively performed.

18 Claims, 13 Drawing Sheets

100

(56)     References Cited

U.S. PATENT DOCUMENTS

| 10,607,666 | B2  |        | 3/2020 | Hong |                |
|------------|-----|--------|--------|------|----------------|
| 2002/0094626 | A1 | *    | 7/2002 | Park | G11C 7/06      |
|            |     |        |        |      | 438/200        |
| 2009/0058474 | A1 | *    | 3/2009 | Kim  | H03K 19/018585 |
|            |     |        |        |      | 327/108        |
| 2019/0295612 | A1 | *    | 9/2019 | Hong | G11C 7/06      |
| 2021/0225422 | A1 | *    | 7/2021 | Jung | G11C 11/4091   |
| 2022/0068359 | A1 | *    | 3/2022 | Shin | G11C 7/1084    |
| 2022/0270665 | A1 | *    | 8/2022 | Park | G11C 29/022    |
| 2023/0143365 | A1 | *    | 5/2023 | Kim  | G11C 7/1057    |
|            |     |        |        |      | 365/189.17     |

FOREIGN PATENT DOCUMENTS

| KR | 10-2009-0128607 | A  | 12/2009 |
|----|-----------------|----|---------|
| KR | 10-0940852      | B1 | 2/2010  |

* cited by examiner

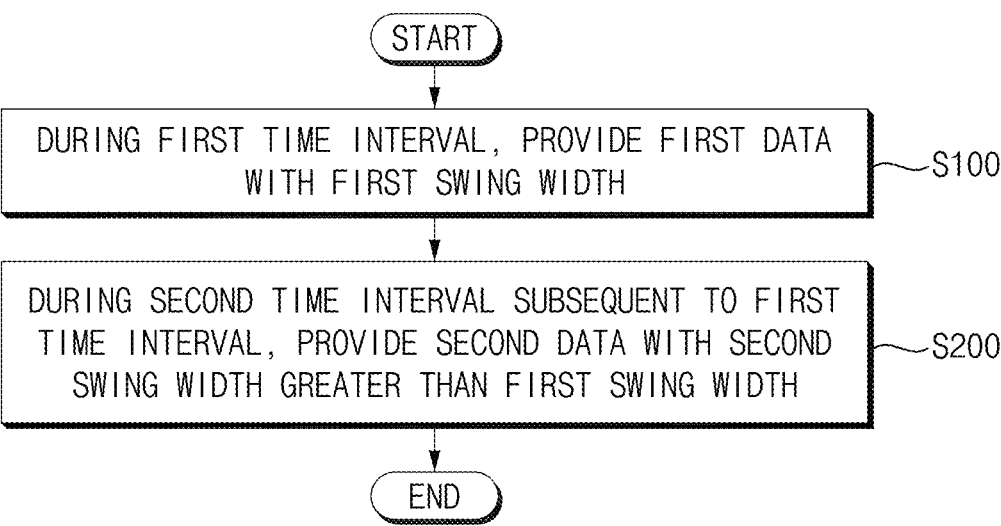

```
        ( START )
            │
            ▼
┌──────────────────────────────────────────┐
│  DURING FIRST TIME INTERVAL, PROVIDE      │
│  FIRST DATA WITH FIRST SWING WIDTH        │───S100
└──────────────────────────────────────────┘
            │
            ▼
┌──────────────────────────────────────────┐
│  DURING SECOND TIME INTERVAL SUBSEQUENT   │
│  TO FIRST TIME INTERVAL, PROVIDE SECOND   │───S200
│  DATA WITH SECOND SWING WIDTH GREATER     │
│  THAN FIRST SWING WIDTH                   │
└──────────────────────────────────────────┘
            │
            ▼
         ( END )
```

FIG. 13

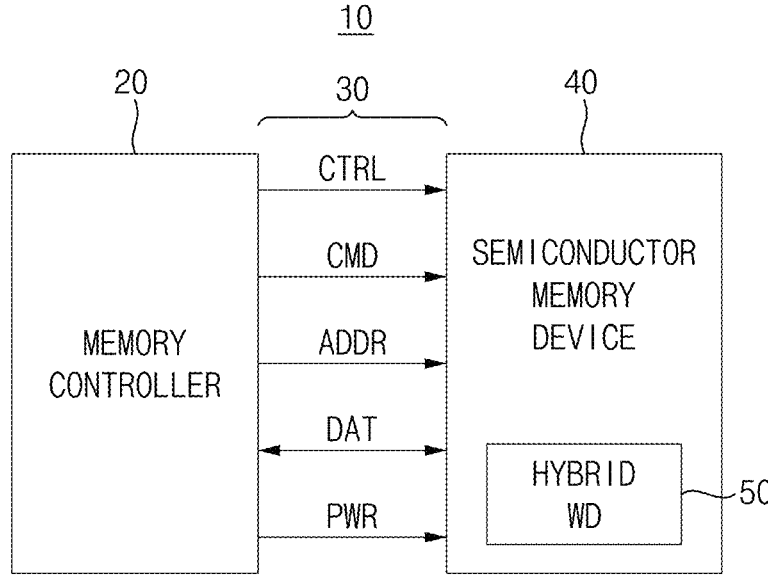

WRITE DRIVER WITH SELECTIVE VOLTAGE SWING FOR MEMORY DEVICES

CROSS-REFERENCE TO RELATED APPLICATION

This application claims priority under 35 USC § 119 to Korean Patent Application No. 10-2023-0172037 filed on Dec. 1, 2023 in the Korean Intellectual Property Office (KIPO), the contents of which are herein incorporated by reference in their entirety.

BACKGROUND

1. Technical Field

Example embodiments relate generally to semiconductor integrated circuits, and more particularly to write drivers, and semiconductor memory devices including the write drivers.

2. Description of the Related Art

Semiconductor memory devices may be divided into two categories depending upon whether or not they retain stored data when disconnected from a power supply. These categories include volatile memory devices, which lose stored data when disconnected from power, and nonvolatile memory devices, which retain stored data when disconnected from power. While volatile memory devices may perform read and write operations at a high speed, contents stored therein may be lost at power-off. Since nonvolatile memory devices retain contents stored therein even at power-off, they may be used to store data that needs to be retained.

Various structures are being adopted to increase the density of semiconductor memory devices and reduce the size of semiconductor memory devices. In addition, various structures are being adopted to increase the operating speed of semiconductor memory devices and reduce the power consumption of semiconductor memory devices. Various methods are being studied to achieve all of the above-mentioned objectives.

Various methods are being studied to achieve all of the above-mentioned objectives.

SUMMARY

At least one example embodiment of the present disclosure provides a write driver capable of efficiently reducing power consumption as well as writing time.

At least one example embodiment of the present disclosure provides a write driver capable of efficiently reducing power consumption while increasing the speed of write operations.

According to example embodiments, a write driver performing a write operation on a semiconductor memory device includes a first pull-up circuit, a second pull-up circuit and a pull-down circuit. The first pull-up circuit is connected to an output terminal, and pulls up the output terminal based on a power supply voltage and a first pull-up control signal. The second pull-up circuit is connected to the output terminal, and pulls up the output terminal based on the power supply voltage and a second pull-up control signal. The pull-down circuit is connected to the output terminal, and pulls down the output terminal based on a ground voltage and a pull-down control signal. A first pull-up operation for pulling up the output terminal using the first pull-up circuit, and a second pull-up operation for pulling up the output terminal using the second pull-up circuit are selectively performed.

According to example embodiments, a semiconductor memory device includes a memory cell array, a plurality of bitline sense amplifiers and a plurality of write drivers. The memory cell array includes a plurality of memory cells connected to a plurality of wordlines and a plurality of bitlines. The plurality of bitline sense amplifiers are connected to the memory cell array through the plurality of bitlines. The plurality of write drivers are connected to the plurality of bitline sense amplifiers through a plurality of global input/output (I/O) lines, and perform a write operation on the memory cell array. Each of the plurality of write drivers includes a first pull-up circuit, a second pull-up circuit and a pull-down circuit. The first pull-up circuit is connected to an output terminal, and pulls up the output terminal based on a power supply voltage and a first pull-up control signal. The second pull-up circuit is connected to the output terminal, and pulls up the output terminal based on the power supply voltage and a second pull-up control signal. The pull-up the output terminal using the first pull-up circuit, and a second pull-up operation for pulling up the output terminal using the second pull-up circuit are selectively performed. As used herein, references to "pulling up," "pulls up," or a "pull-up" of a particular terminal refer to pulling up a voltage at the particular terminal to a higher voltage level, and do not imply a physical movement of the terminal itself. Similarly, references to "pulling down," "pulls down," or a "pull-down" of a particular terminal refer to pulling down a voltage at the particular terminal to a lower voltage level, and do not imply a physical movement of the terminal itself.

According to example embodiments, a write driver performing a write operation on a semiconductor memory device includes a first n-type metal oxide semiconductor (NMOS) transistor, a p-type metal oxide semiconductor (PMOS) transistor and a second NMOS transistor. The first NMOS transistor is connected between a power supply terminal receiving a power supply voltage and an output terminal connected to a global input/output (I/O) line, and includes a gate electrode to which a first pull-up control signal is applied. The PMOS transistor is connected between the power supply terminal and the output terminal, and includes a gate electrode to which a second pull-up control signal is applied. The second NMOS transistor is connected between the output terminal and a ground terminal receiving a ground voltage, and includes a gate electrode to which a pull-down control signal is applied. The write operation is an operation in which a plurality of data that are consecutive data are stored in the semiconductor memory device at once. In an interval during which the plurality of data are provided, a first pull-up operation for pulling up the output terminal based on the power supply voltage and the first pull-up control signal is performed during a first portion of the time interval, a second pull-up operation for pulling up the output terminal based on the power supply voltage and the second pull-up control signal is performed during a second portion of the time interval subsequent to the first portion of the time interval, and a pull-down operation for pulling down the output terminal based on the ground voltage and the pull-down control signal is performed during the first portion of the time interval and the second portion of the time interval. In the first portion of the time interval, the PMOS transistor is disabled, and a voltage at the output terminal has a first swing width based on the first pull-up operation and the pull-down operation. In the second portion of the time interval, the first NMOS transistor is disabled, and the voltage at the output terminal has a second swing width greater than the first swing width based on the second pull-up operation and the pull-down operation.

The write driver and the semiconductor memory device according to example embodiments may include different types of the transistors that selectively perform the pull-up operation and operate based on the same power supply voltage. The small-swing operation may be performed on the voltage at the output terminal during the first portion of the time interval, and thus the power consumption may be reduced. The full-swing operation may be performed on the voltage at the output terminal during the second portion of the time interval subsequent to the first portion of the time interval, and thus the total write time may be reduced. Accordingly, the operating performance and efficiency may be improved or enhanced by reducing the power consumption and the total write time.

BRIEF DESCRIPTION OF THE DRAWINGS

Illustrative, non-limiting example embodiments will be more clearly understood from the following detailed description taken in conjunction with the accompanying drawings.

FIGS. 3, 4A and 4B are diagrams for describing an operation of a write driver according to example embodiments.

FIG. 5 is a block diagram illustrating a semiconductor memory device according to example embodiments.

FIGS. 7 and 8 are diagrams illustrating examples where a write driver according to example embodiments is included in a semiconductor memory device according to example embodiments.

FIG. 11 is a diagram for describing an operation of a write driver according to example embodiments.

FIG. 12 is a flowchart illustrating a method of operating a write driver according to example embodiments.

FIG. 13 is a block diagram illustrating a memory system according to example embodiments.

DETAILED DESCRIPTION OF THE EMBODIMENTS

Figure 1:
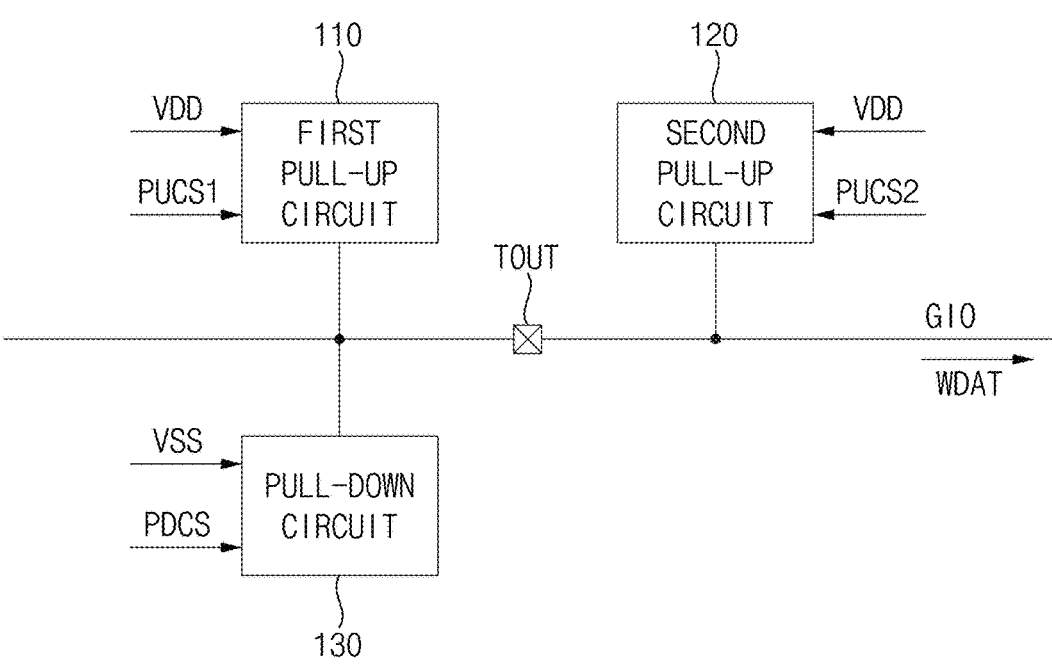
FIG. 1 is a block diagram illustrating a write driver according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating a write driver according to example embodiments.

Referring to FIG. 1, a write driver 100 includes a first pull-up circuit 110, a second pull-up circuit 120 and a pull-down circuit 130. The first pull-up circuit 110, the second pull-up circuit 120 and the pull-down circuit 130 may each, respectively, ensure a voltage (e.g., VML, VDDL, VDDL1, VDDL2, VSSL, etc. as described below) is well-defined at an output terminal (e.g., TOUT as described below).

In some example embodiments, as will be described with reference to FIGS. 5, 7 and 8, the write driver 100 may be included in a semiconductor memory device, and may be used to perform a write operation on the semiconductor memory device.

The first pull-up circuit 110 is connected to an output terminal TOUT, and pulls up the output terminal TOUT based on a power supply voltage VDD and a first pull-up control signal PUCS1. For example, the output terminal TOUT may be connected to a global input/output (I/O) line GIO of the semiconductor memory device. The write driver 100 may be referred to as a global I/O line driver.

The second pull-up circuit 120 is connected to the output terminal TOUT, and pulls up the output terminal TOUT based on the power supply voltage VDD and a second pull-up control signal PUCS2. For example, the first pull-up circuit 110 and the second pull-up circuit 120 may operate based on the same voltage (e.g., the power supply voltage VDD). The power supply voltage VDD is maintained at a constant voltage (i.e., same voltage). For example the operating voltage VDD is maintained at the same voltage (i.e., VDD) during operation of the first pull-up circuit 110 and the second pull-up circuit 120.

The pull-down circuit 130 is connected to the output terminal TOUT, and pulls down the output terminal TOUT based on a ground voltage VSS and a pull-down control signal PDCS.

As described above, when a first pull-up operation for pulling up the output terminal TOUT using the first pull-up circuit 110, a second pull-up operation for pulling up the output terminal TOUT using the second pull-up circuit 120, and a pull-down operation for pulling down the output terminal TOUT using the pull-down circuit 130 are performed, write data WDAT that is a target of the write operation may be output through the output terminal TOUT and the global I/O line GIO, and the write operation may be performed on the semiconductor memory device based on write data WDAT.

In some example embodiments, the first pull-up circuit 110 and the second pull-up circuit 120 may include different types of transistors. For example, the first pull-up circuit 110 and the second pull-up circuit 120 may be implemented with different types of transistors that operate based on the same power supply voltage VDD. Therefore, a swing width of a voltage at the output terminal TOUT may be controlled or adjusted variously, and a time required for the write operation (e.g., the total write time) may be reduced.

In some example embodiments, the first pull-up circuit 110 and the pull-down circuit 130 may include the same type of transistors. For example, the first pull-up operation and the pull-down operation may be performed using the same type of transistors. Therefore, the swing width of the voltage at the output terminal TOUT may be reduced, and power consumption may be reduced.

Detailed circuit configurations of the first pull-up circuit 110, the second pull-up circuit 120 and the pull-down circuit 130 included in the write driver 100 will be described with reference to FIG. 2.

In some example embodiments, the first pull-up operation for pulling up the output terminal TOUT using the first pull-up circuit 110, and the second pull-up operation for pulling up the output terminal TOUT using the second pull-up circuit 120 may be selectively performed. For example, while the first pull-up circuit 110 is enabled (or activated) to perform the first pull-up operation, the second pull-up circuit 120 may be disabled (or deactivated). For example, while the second pull-up circuit 120 is enabled to perform the second pull-up operation, the first pull-up circuit 110 may be disabled. In other words, the first pull-up circuit 110 and the second pull-up circuit 120 may not be enabled at the same time or simultaneously.

In some example embodiments, the write operation may be an operation in which a plurality of data, that are consecutive data, are stored in the semiconductor memory device at once. In other words, the write data WDAT may include the plurality of data that are consecutive data. In one example, in the entire (or total) time interval during which the plurality of data are provided, the first pull-up circuit 110 may be enabled to perform the first pull-up operation and the second pull-up circuit 120 may be disabled, during a certain time interval. In another example, in the entire time interval during which the plurality of data are provided, the second pull-up circuit 120 may be enabled to perform the second pull-up operation and the first pull-up circuit 110 may be disabled, during another certain time interval.

Detailed operations of providing the write data WDAT (e.g., the plurality of data) while the write operation is performed will be described with reference to FIGS. 3, 4A and 4B.

Figure 2:
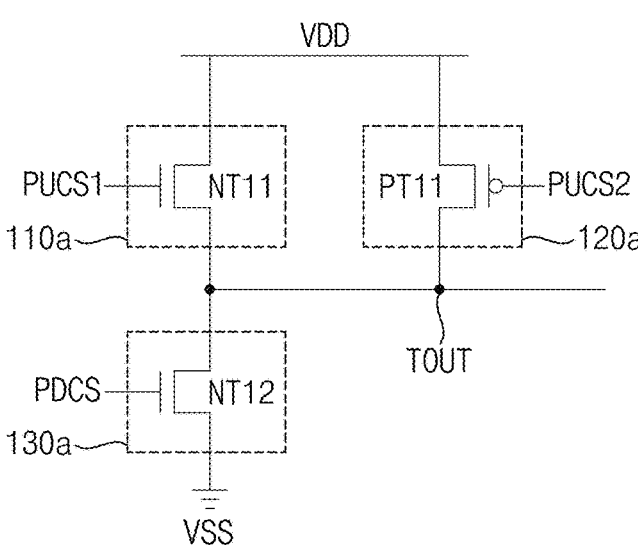
FIG. 2 is a circuit diagram illustrating an example of a write driver of FIG. 1.

FIG. 2 is a circuit diagram illustrating an example of a write driver of FIG. 1.

Referring to FIG. 2, a write driver 100a includes a first pull-up circuit 110a, a second pull-up circuit 120a and a pull-down circuit 130a. The descriptions repeated with or overlapping with descriptions of FIG. 1 will be omitted in the interest of brevity.

The first pull-up circuit 110a may include a first n-type metal oxide semiconductor (NMOS) transistor NT11. The first NMOS transistor NT11 may be connected between a power supply terminal receiving the power supply voltage VDD and the output terminal TOUT, and may include a gate electrode to which the first pull-up control signal PUCS1 is applied. The first NMOS transistor NT11 may be turned on and off (or may be activated and deactivated) in response to the first pull-up control signal PUCS1.

The second pull-up circuit 120a may include a p-type metal oxide semiconductor (PMOS) transistor PT11. The PMOS transistor PT11 may be connected between the power supply terminal receiving the power supply voltage VDD and the output terminal TOUT, and may include a gate electrode to which the second pull-up control signal PUCS2 is applied. The PMOS transistor PT11 may be turned on and off in response to the second pull-up control signal PUCS2.

As described with reference to FIG. 1, the first pull-up operation using the first pull-up circuit 110 and the second pull-up operation using the second pull-up circuit 120 may be selectively performed, and thus the write driver 100a may perform the pull-up operation by selecting only one of the first NMOS transistor NT11 and the PMOS transistor PT11.

The pull-down circuit 130a may include a second NMOS transistor NT12. The second NMOS transistor NT12 may be connected between the output terminal TOUT and a ground terminal receiving the ground voltage VSS, and may include a gate electrode to which the pull-down control signal PDCS is applied. The second NMOS transistor NT12 may be turned on/off in response to the pull-down control signal PDCS.

Figure 3:
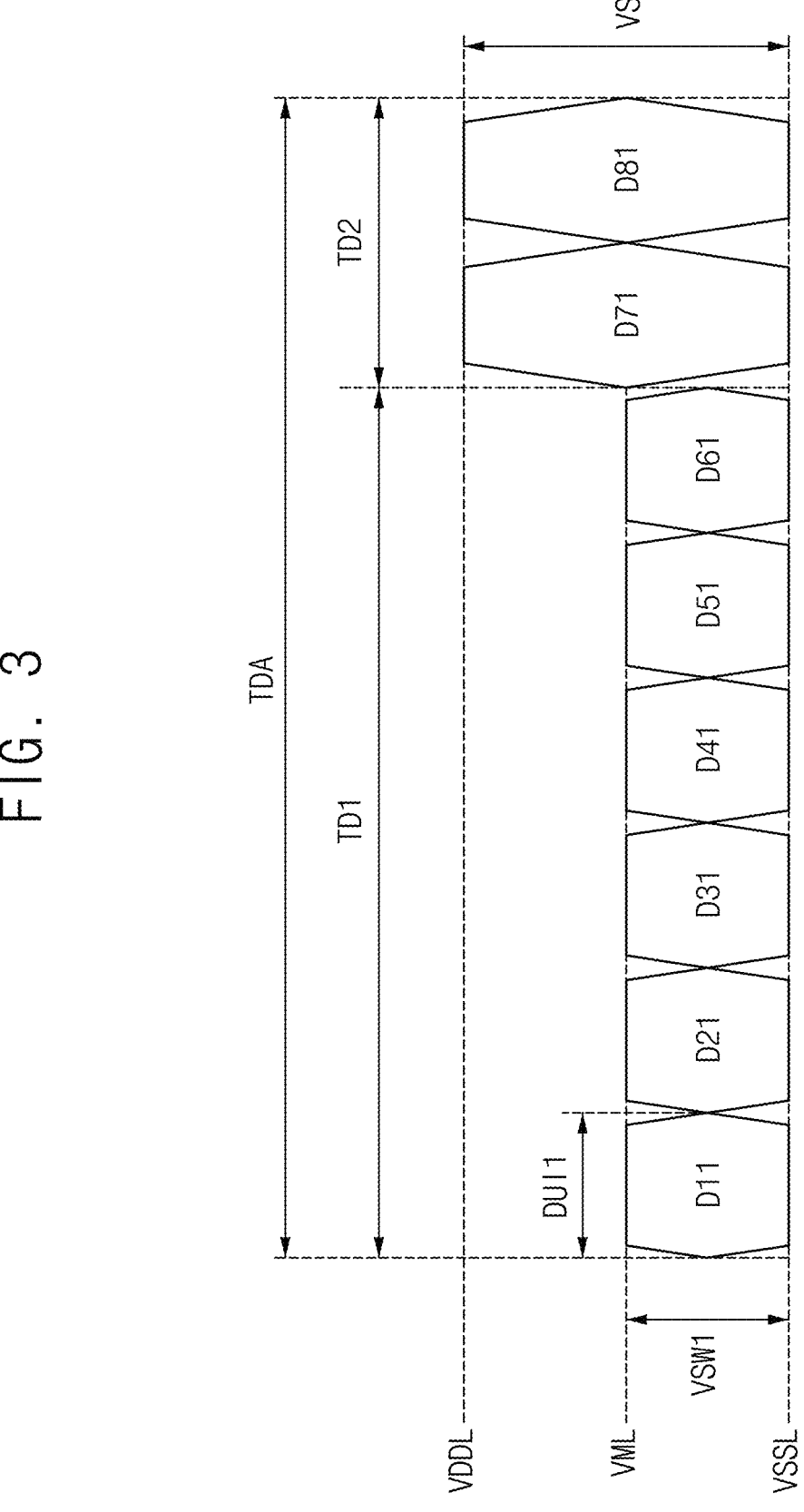
Figure 4A:
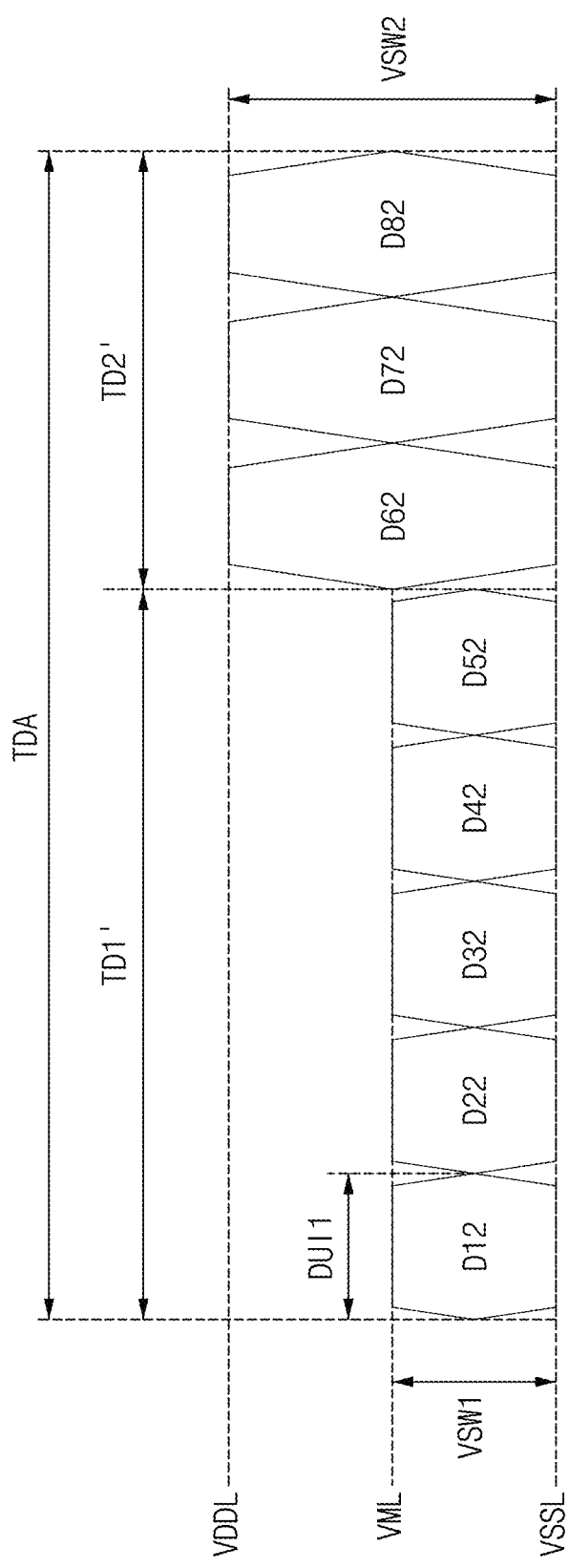
Figure 4B:
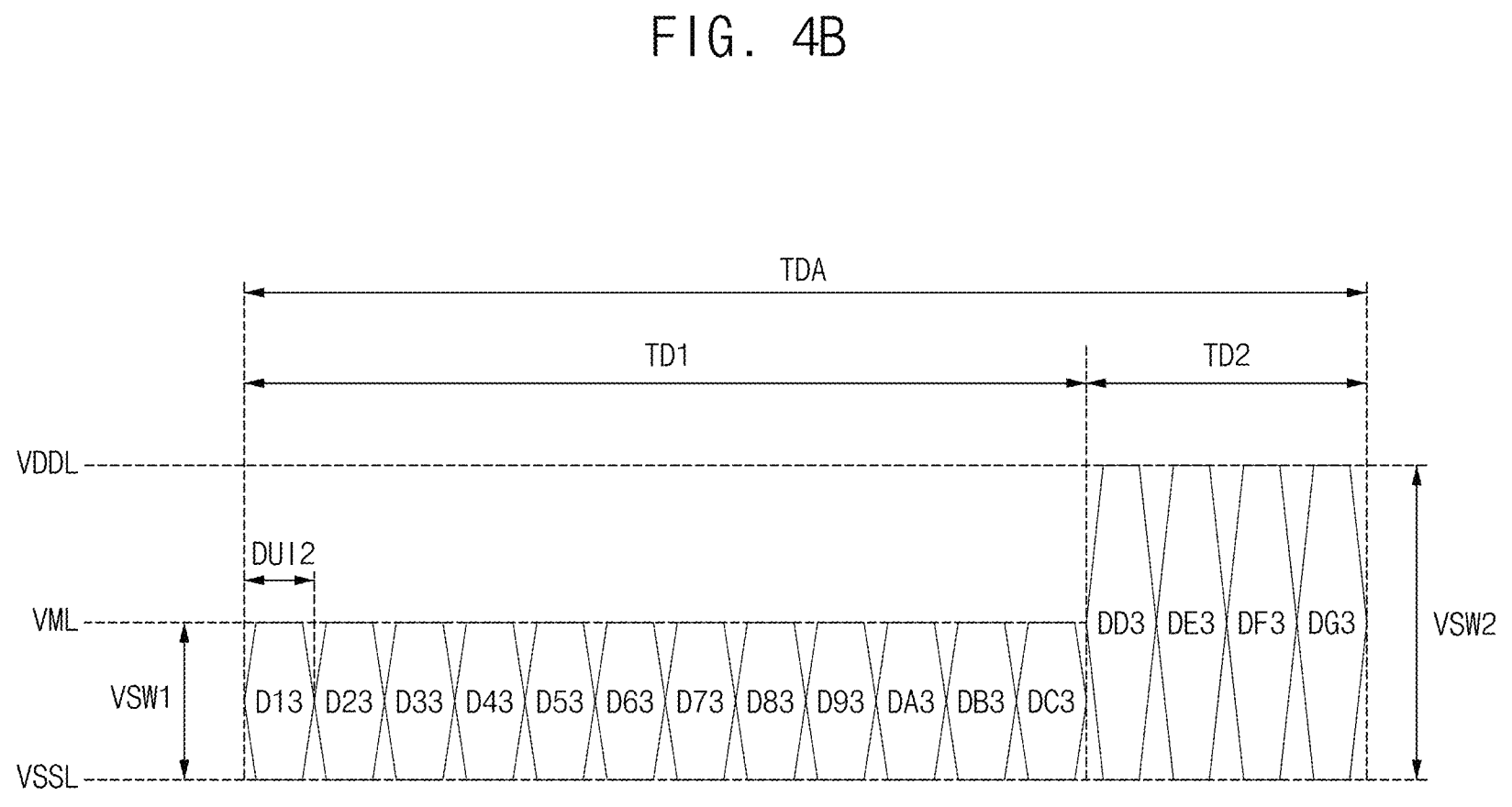

FIGS. 3, 4A and 4B are diagrams for describing an operation of a write driver according to example embodiments.

Referring to FIG. 3, an operation of providing data using the write drivers 100 and 100a according to example embodiments is illustrated. For example, FIG. 3 illustrates the voltage at the output terminal TOUT, e.g., a voltage of the global I/O line GIO connected to the output terminal TOUT.

While the write operation is performed on the semiconductor memory device, an active command may be received first, a write command and write data may be received next, and then the write data may be applied to and stored in a memory cell array included in the semiconductor memory device based on the write command. Thereafter, a precharge command may be received, and a precharge operation may be performed based on the precharge command. FIG. 3 illustrates an operation of transmitting the write data to the memory cell array after the write command is received during the write operation.

As described with reference to FIG. 1, the write data that is the target of the write operation may include a plurality of data D11, D21, D31, D41, D51, D61, D71 and D81 that are consecutive data, and the write operation may be an operation of storing the plurality of data D11, D21, D31, D41, D51, D61, D71 and D81 at once. Although FIG. 3 illustrates eight consecutive data D11, D21, D31, D41, D51, D61, D71 and D81, example embodiments are not limited thereto, and the number of data stored at once may be variously determined according to example embodiments.

Each of the plurality of data D11, D21, D31, D41, D51, D61, D71 and D81 may be provided during a first unit time interval DUI1. Thus, the entire time interval TDA during which the plurality of data D11, D21, D31, D41, D51, D61, D71 and D81 are provided may be obtained by multiplying the number (or quantity) of the plurality of data D11, D21, D31, D41, D51, D61, D71 and D81 by the first unit time interval DUI1. For example, TDA=8*DUI1 in FIG. 3, however, example embodiments are not limited thereto.

In some example embodiments, as will be described with reference to FIG. 7, the semiconductor memory device may further include a complementary global I/O line GIOB that operates in pair with the global I/O line GIO and operates complementary to the global I/O line GIO, and write drivers having the same structure may be connected to the global I/O line GIO and the complementary global I/O line (GIOB), respectively. For example, when the global I/O line GIO has a logic high level, the complementary global I/O line GIOB may have a logic low level opposite to the logic high level. Although FIG. 3 illustrates that each of the plurality of data D11, D21, D31, D41, D51, D61, D71 and D81 has both the logic high level and the logic low level during one first unit time interval DUI1, each of the plurality of data D11, D21, D31, D41, D51, D61, D71 and D81 that is provided through one output terminal TOUT and one global I/O line GIO may have one of the logic high level and the logic low level during one first unit time interval DUI1.

The entire time interval TDA during which the plurality of data D11, D21, D31, D41, D51, D61, D71 and D81 are provided may include a first time interval TD1 and a second time interval TD2 subsequent to (or after) the first time interval TD1. For example, the first time interval TD1 and the second time interval TD2 may not overlap with each other.

During the first time interval TD1 of the entire time interval TDA, the first pull-up circuit 110 and the pull-down circuit 130 may be enabled to perform the first pull-up operation and the pull-down operation, and the second pull-up circuit 120 may be disabled.

For example, when the data D11 has a value of '1', the first NMOS transistor NT11 may be turned on based on the first pull-up control signal PUCS1 to perform the first pull-up operation, and the voltage at the output terminal TOUT (e.g., the voltage of the global I/O line GIO) may have a first voltage level VML corresponding to the logic high level. For example, the first voltage level VML may be lower than a voltage level of the power supply voltage VDDL. For example, the first voltage level VML may be a voltage level corresponding to a voltage obtained by subtracting a threshold voltage of the first NMOS transistor NT11 from the power supply voltage VDDL. In this case, the second NMOS transistor NT12 may be turned off based on the pull-down control signal PDCS.

For example, when the data D11 has a value of '0', the second NMOS transistor NT12 may be turned on based on the pull-down control signal PDCS to perform the pull-down operation, and the voltage at the output terminal TOUT (e.g., the voltage of the global I/O line GIO) may have a voltage level VSSL of the ground voltage VSS corresponding to the logic low level. In this case, the first NMOS transistor NT11 may be turned off based on the first pull-up control signal PUCS1.

Similarly, one of the first pull-up operation and the pull-down operation may be performed on each of the data D21, D31, D41, D51 and D61, depending on a value of each of the data D21, D31, D41, D51 and D61. Therefore, the voltage at the output terminal TOUT may have the first voltage level VML or the voltage level VSSL of the ground voltage VSS during the first unit time interval DUI1 corresponding to each data.

In other words, in the first time interval TD1, the first pull-up control signal PUCS1 and the pull-down control signal PDCS may be complementary activated and deactivated, and thus the first pull-up circuit 110 and the pull-down circuit 130 (e.g., the first NMOS transistor NT11 and the second NMOS transistor NT12) may be complementary enabled and disabled. In the first time interval TD1, the second pull-up control signal PUCS2 may always be deactivated, and the second pull-up circuit 120 (e.g., the PMOS transistor PT11) may always be disabled.

In addition, in the first time interval TD1, the voltage at the output terminal TOUT (e.g., the voltage of the global I/O line GIO) may have a first swing width VSW1. For example, a swing width may represent or indicate a difference between the logic high level and the logic low level, and/or a voltage difference between a high voltage and a low voltage. For example, a difference between the first voltage level VML corresponding to the logic high level in the first time interval TD1 and the voltage level VSSL of the ground voltage VSS corresponding to the logic low level may represent the first swing width VSW1. In other words, in the first time interval TD1, the voltage at the output terminal TOUT may swing or toggle between the first voltage level VML that is relatively low voltage and the voltage level VSSL of the ground voltage VSS (e.g., a small-swing operation may be performed on the voltage at the output terminal TOUT).

During the second time interval TD2 subsequent to the first time interval TD1 of the entire time interval TDA, the second pull-up circuit 120 and the pull-down circuit 130 may be enabled to perform the second pull-up operation and the pull-down operation, and the first pull-up circuit 110 may be disabled.

For example, when the data D71 has the value of '1', the PMOS transistor PT11 may be turned on based on the second pull-up control signal PUCS2 to perform the second pull-up operation, and the voltage at the output terminal TOUT (e.g., the voltage of the global I/O line GIO) may have a voltage level VDDL of the power supply voltage VDD corresponding to the logic high level. For example, the voltage level VDDL of the power supply voltage VDD may be higher than the first voltage level VML. In this case, the second NMOS transistor NT12 may be turned off based on the pull-down control signal PDCS.

For example, when the data D71 has the value of '0', the second NMOS transistor NT12 may be turned on based on the pull-down control signal PDCS to perform the pull-down operation, and the voltage at the output terminal TOUT (e.g., the voltage of the global I/O line GIO) may have the voltage level VSSL of the ground voltage VSS corresponding to the logic low level. In this case, the PMOS transistor PT11 may be turned off based on the second pull-up control signal PUCS2.

Similarly, one of the second pull-up operation and the pull-down operation may be performed on the data D81, depending on a value of the data D81. Therefore, the voltage at the output terminal TOUT may have the voltage level VDDL of the power supply voltage VDD or the voltage level VSSL of the ground voltage VSS during the first unit time interval DUI1 corresponding to the data D81.

In other words, in the second time interval TD2, the second pull-up control signal PUCS2 and the pull-down control signal PDCS may be complementary activated and deactivated, and thus the second pull-up circuit 120 and the pull-down circuit 130 (e.g., the PMOS transistor PT11 and the second NMOS transistor NT12) may be complementary enabled and disabled. In the second time interval TD2, the first pull-up control signal PUCS1 may always be deactivated, and the first pull-up circuit 110 (e.g., the first NMOS transistor NT11) may always be disabled.

In addition, in the second time interval TD2, the voltage at the output terminal TOUT (e.g., the voltage of the global I/O line GIO) may have a second swing width VSW2 that is greater than the first swing width VSW1. For example, a difference between the voltage level VDDL of the power supply voltage VDD corresponding to the logic high level in the second time interval TD2 and the voltage level VSSL of the ground voltage VSS corresponding to the logic low level may represent the second swing width VSW2. In other words, in the second time interval TD2, the voltage at the output terminal TOUT may swing or toggle between the voltage level VDDL of the power supply voltage VDD that is a relatively high voltage and the voltage level VSSL of the ground voltage VSS (e.g., a full-swing operation may be performed on the voltage at the output terminal TOUT).

As described above, when the small-swing operation is performed on the voltage at the output terminal TOUT during the first time interval TD1, the power consumption may be reduced. In addition, when the full-swing operation is performed on the voltage at the output terminal TOUT during the second time interval TD2, a time (e.g., a row precharge time tRP) required for the precharge operation, which is performed after the plurality of data D11, D21, D31, D41, D51, D61, D71 and D81) are stored, may be reduced, and the total write time (e.g., tWRITE), which represents a time interval from receiving the active command to completing the precharge operation (or until receiving a next active command), may be reduced. Accordingly, the operating performance and efficiency may be improved or enhanced by reducing the power consumption and the total write time.

In addition, a delay time (e.g. tRCD) between a row active time (e.g. tRAS) and a column active time (e.g. tCAS), a time interval (e.g., tAA) from receiving a read command to outputting read data, a time (e.g., tREF) required for a refresh operation, etc. may be improved or enhanced.

Referring to FIG. 4A, an operation of providing data using the write drivers 100 and 100a according to example embodiments is illustrated. For example, FIG. 4A illustrates the voltage at the output terminal TOUT. The descriptions repeated with or overlapping with descriptions of FIG. 3 will be omitted in the interest of brevity.

The write data that is the target of the write operation may include a plurality of data D12, D22, D32, D42, D52, D62, D72 and D82 that are consecutive data. The entire time interval TDA during which the plurality of data D12, D22, D32, D42, D52, D62, D72 and D82 are provided may include a first time interval TD1' and a second time interval TD2' subsequent to the first time interval TD1'.

In some example embodiments, a length of the second time interval TD2' may be changeable. For example, the length of the second time interval TD2' in FIG. 4A may be longer than a length of the second time interval TD2 in FIG. 3. However, example embodiments are not limited thereto, and the length of the second time interval may be shorter than the length of the second time interval TD2 in FIG. 3.

In some example embodiments, a length of the entire time interval TDA may not be changed and may be maintained, and thus a length of the first time interval TD1' may also be changed when the length of the second time interval TD2' may be changed. For example, when the length of the second time interval TD2' in FIG. 4A is longer than the length of the second time interval TD2 in FIG. 3, the length of the first time interval TD1'in FIG. 4A may be shorter than a length of the first time interval TD1 in FIG. 3. However, example embodiments are not limited thereto, and the length of the first time interval TD1' may be longer than the length of the first time interval TD1 in FIG. 3, and/or the length of the entire time interval TDA may be changed.

In some example embodiments, when the length of the second time interval TD2' is changed, the number of the data D62, D72 and D82 included in the second time interval TD2' may also be changed. For example, in examples of FIGS. 3 and 4A, a time interval during which single data is provided may be the same as or equal to each other (e.g., the first unit time interval DUI1). For example, when the length of the second time interval TD2' in FIG. 4A is longer than the length of the second time interval TD2 in FIG. 3, the number (e.g., three) of the data D62, D72 and D82 included in the second time interval TD2' of FIG. 4A may be greater than the number (e.g., two) of the data D71 and D81 included in the second time interval TD2 of FIG. 3. Similarly, when the length of the first time interval TD1' is changed, the number of the data D12, D22, D32, D42 and D52 included in the first time interval TD1' may also be changed. However, example embodiments are not limited thereto, and a length of the unit time interval during which single data is provided may be changed, and/or the number of data included in each of the first and second time intervals may be maintained without change even if the lengths of the first and second time intervals are changed.

Referring to FIG. 4B, an operation of providing data using the write drivers 100 and 100a according to example embodiments is illustrated. For example, FIG. 4B illustrates the voltage at the output terminal TOUT. The descriptions repeated with or overlapping with descriptions of FIG. 3 will be omitted in the interest of brevity.

The write data that is the target of the write operation may include a plurality of data D13, D23, D33, D43, D53, D63, D73, D83, D93, DA3, DB3, DC3, DD3, DE3, DF3 and DG3 that are consecutive data. Each of the plurality of data D13, D23, D33, D43, D53, D63, D73, D83, D93, DA3, DB3, DC3, DD3, DE3, DF3 and DG3 may be provided during a second unit time interval DUI2 different from the first unit time interval DUI1. For example, the second unit time interval DUI2 may be shorter than the first unit time interval DUI1. However, example embodiments are not limited thereto.

In some example embodiments, among the plurality of data D13, D23, D33, D43, D53, D63, D73, D83, D93, DA3, DB3, DC3, DD3, DE3, DF3 and DG3, the number of the data DD3, DE3, DF3 and DG3 provided during the second time interval TD2 may be changeable. For example, in examples of FIGS. 3 and 4B, the length of the second time interval TD2 may be the same as or equal to each other. For example, when the second unit time interval DUI2 is shorter than the first unit time interval DUI1, the number (e.g., four) of the data DD3, DE3, DF3 and DG3 included in the second time interval TD2 of FIG. 4B may be greater than the number (e.g., two) of the data D71 and D81 included in the second time interval TD2 of FIG. 3. However, example embodiments are not limited thereto.

In some example embodiments, the length of the entire time interval TDA and the length of the first time interval TD1 are also maintained without change, and the number of the data D13, D23, D33, D43, D53, D63, D73, D83, D93, DA3, DB3 and DC3 provided during the first time interval TD1 may also be changed. For example, the number (e.g., twelve) of the data D13, D23, D33, D43, D53, D63, D73, D83, D93, DA3, DB3 and DC3 included in the first time interval TD1 of FIG. 4B may be greater than the number (e.g., six) of data D11, D21, D31, D41, D51 and D61 included in the first time interval TD1 of FIG. 3. However, example embodiments are not limited thereto.

As described above, the first time interval for selecting the first NMOS transistor NT11 and the second time interval for selecting the PMOS transistor PT11 may be flexibly changed, and various parameters may be used to change such time intervals.

Figure 5:
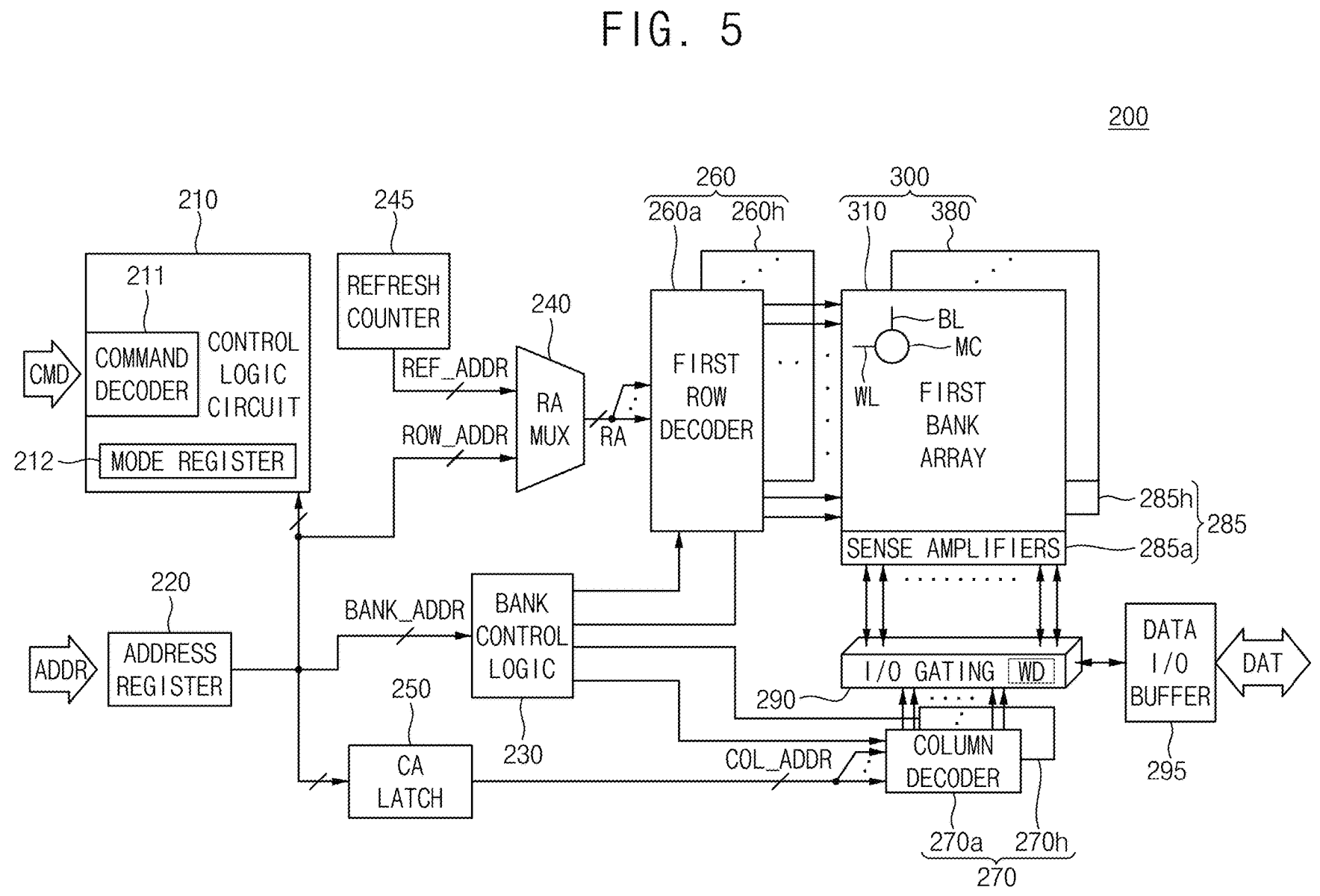

FIG. 5 is a block diagram illustrating a semiconductor memory device according to example embodiments.

Referring to FIG. 5, a semiconductor memory device 200 may include a memory cell array 300, a control logic circuit 210, an address register 220, a bank control logic circuit 230, a row address multiplexer 240, a refresh counter 245, a column address latch 250, a row decoder 260, a column decoder 270, a sense amplifier unit 285, an input/output (I/O) gating circuit 290 and a data I/O buffer 295. For example, the semiconductor memory device 200 may be one of various volatile memory devices such as a dynamic random access memory (DRAM).

The memory cell array 300 may include first to eighth bank arrays 310 to 380 (e.g., first to eighth bank arrays 310, 320, 330, 340, 350, 360, 370 and 380). The row decoder 260 may include first to eighth bank row decoders 260a to 260h connected respectively to the first to eighth bank arrays 310 to 380. The column decoder 270 may include first to eighth bank column decoders 270a to 270h connected respectively to the first to eighth bank arrays 310 to 380. The sense amplifier unit 285 may include first to eighth bank sense amplifiers 285a to 285h connected respectively to the first to eighth bank arrays 310 to 380.

The first to eighth bank arrays 310 to 380, the first to eighth bank row decoders 260a to 260h, the first to eighth bank column decoders 270a to 270h, and the first to eighth bank sense amplifiers 285a to 285h may form first to eighth banks. Each of the first to eighth bank arrays 310 to 380 may include a plurality of wordlines WL, a plurality of bitlines BL, and a plurality of memory cells MC that are at intersections of the wordlines WL and the bitlines BL.

Although FIG. 5 illustrates the semiconductor memory device 200 including eight banks (and eight bank arrays, eight row decoders, and so on), the semiconductor memory device 200 may include any number of banks; for example, one, two, four, eight, sixteen, or thirty two banks, or any number therebetween one and thirty two.

The address register 220 may receive the address ADDR including a bank address BANK_ADDR, a row address ROW_ADDR, and a column address COL_ADDR from a memory controller (e.g., a memory controller 20 in FIG. 13). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first to eighth bank row decoders 260a to 260h corresponding to the bank address BANK_ADDR may be activated in response to the bank control signals, and one of the first to eighth bank column decoders 270a to 270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first to eighth bank row decoders 260a to 260h.

The activated one of the first to eighth bank row decoders 260a to 260h may decode the row address RA that is output from the row address multiplexer 240, and may activate in the corresponding bank array a wordline WL corresponding to the row address RA. For example, the activated bank row decoder may generate a wordline driving voltage, and may apply the wordline driving voltage to the wordline WL corresponding to the row address RA.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first to eighth bank column decoders 270a to 270h.

The activated one of the first to eighth bank column decoders 270a to 270h may decode the column address COL_ADDR that is output from the column address latch

250, and may control the I/O gating circuit 290 to output data corresponding to the column address COL_ADDR.

The I/O gating circuit 290 may include circuitry configured to gate input/output data. The I/O gating circuit 290 may further include read data latches configured to store data that is output from the first to eighth bank arrays 310 to 380, and may also include write control devices for writing data to the first to eighth bank arrays 310 to 380.

Data DAT read from one of the first to eighth bank arrays 310 to 380 may be sensed by a sense amplifier connected to the one bank array from which the data DAT is to be read, and may be stored in the read data latches. The data DAT stored in the read data latches may be provided to the memory controller via the data I/O buffer 295. Data DAT to be written in one of the first to eighth bank arrays 310 to 380 may be provided to the I/O gating circuit 290 via the data I/O buffer 295 from the memory controller, and the I/O gating circuit 290 may write the data DAT in the one bank array through the write drivers.

The control logic circuit 210 may control operations of the semiconductor memory device 200. For example, the control logic circuit 210 may generate control signals for the semiconductor memory device 200 to perform the write operation and/or the read operation. The control logic circuit 210 may include a command decoder 211 that decodes a command CMD received from the memory controller, and a mode register 212 that sets an operation mode of the semiconductor memory device 200. In some example embodiments, operations described herein as being performed by the control logic circuit 210 may be performed by processing circuitry. For example, the command decoder 211 may generate the control signals corresponding to the command CMD by decoding a write enable signal, a row address strobe signal, a column address strobe signal, a chip selection signal, etc.

The I/O gating circuit 290 may include a plurality of write drivers WD. Each of the plurality of write drivers WD may be the write driver according to example embodiments described with reference to FIGS. 1 through 4B. For example, each of the plurality of write drivers WD may include the first and second pull-up circuits, which selectively perform the pull-up operation and include different types of the transistors operating based on the same power supply voltage. Accordingly, the operating performance and efficiency may be improved or enhanced by reducing the power consumption and the total write time.

Figure 6:
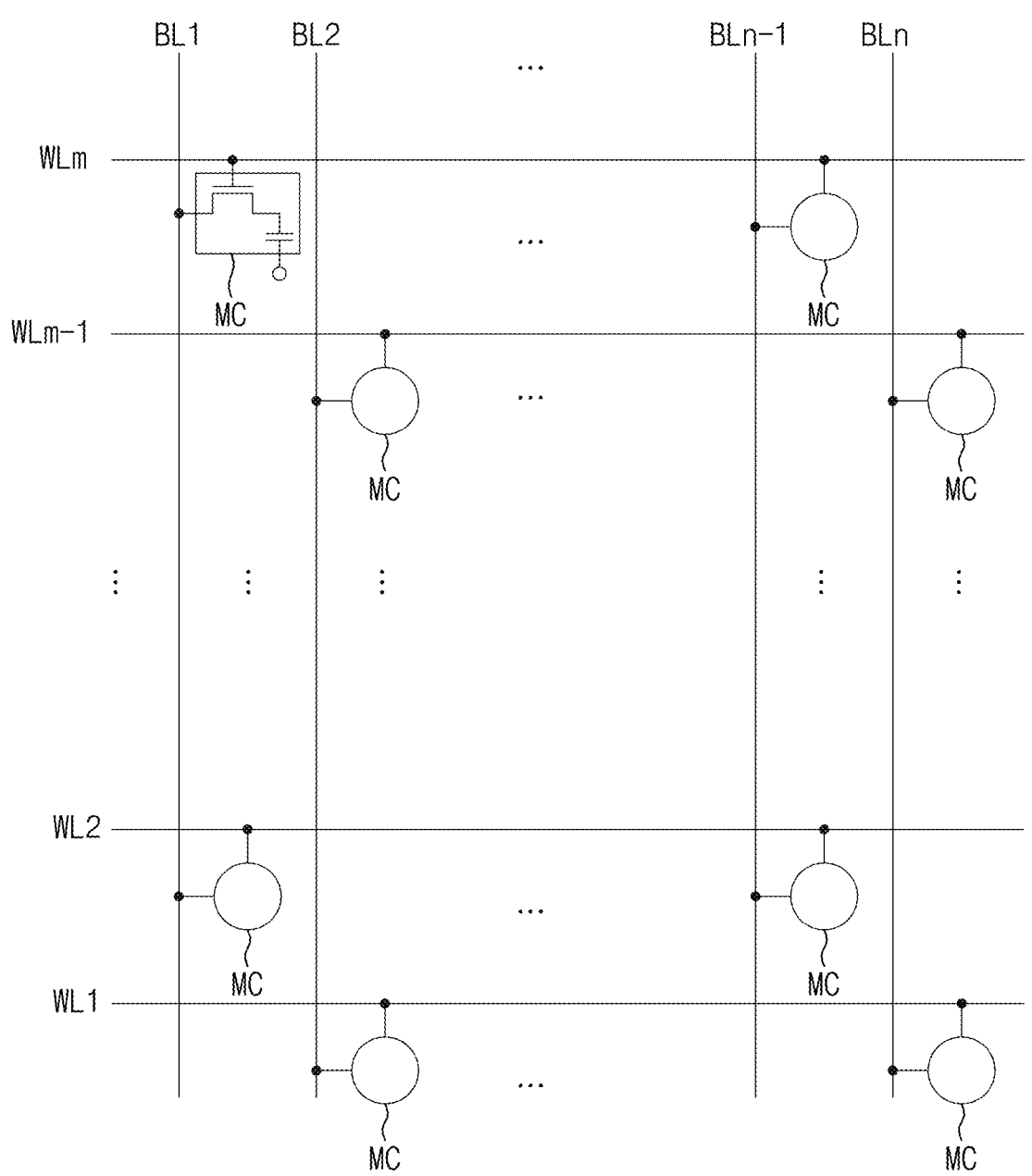
FIG. 6 is a diagram illustrating an example of a memory cell array included in a semiconductor memory device of FIG. 5.

FIG. 6 is a diagram illustrating an example of a memory cell array included in a semiconductor memory device of FIG. 5.

Referring to FIGS. 5 and 6, the first bank array 310 included in the memory cell array 300 may include a plurality of wordlines WL1, WL2, . . . , WLm-1, WLm (where m is a positive integer greater than or equal to two), a plurality of bitlines BL1, BL2, . . . , BLn-1, BLn (where n is a positive integer greater than or equal to two that may or may not be the same as m), and a plurality of memory cells MC arranged at or near intersections between the wordlines WL1 to WLm and the bitlines BL1 to BLn. For example, each of the plurality of memory cells MC may include a DRAM cell structure. The plurality of wordlines WL1 to WLm to which the plurality of memory cells MC are connected may be referred to as rows of the first bank array 310, and the plurality of bitlines BL1 to BLn to which the plurality of memory cells MC are connected may be referred to as columns of the first bank array 310.

Although the semiconductor memory device according to example embodiments is described based on a DRAM, the semiconductor memory device according to example embodiments may be any volatile memory device, and/or any nonvolatile memory device, e.g., a static random access memory (SRAM), a flash memory, a phase-change random access memory (PRAM), a resistive random access memory (RRAM), a magnetic random access memory (MRAM), a ferroelectric random access memory (FRAM), or the like.

Figure 7:
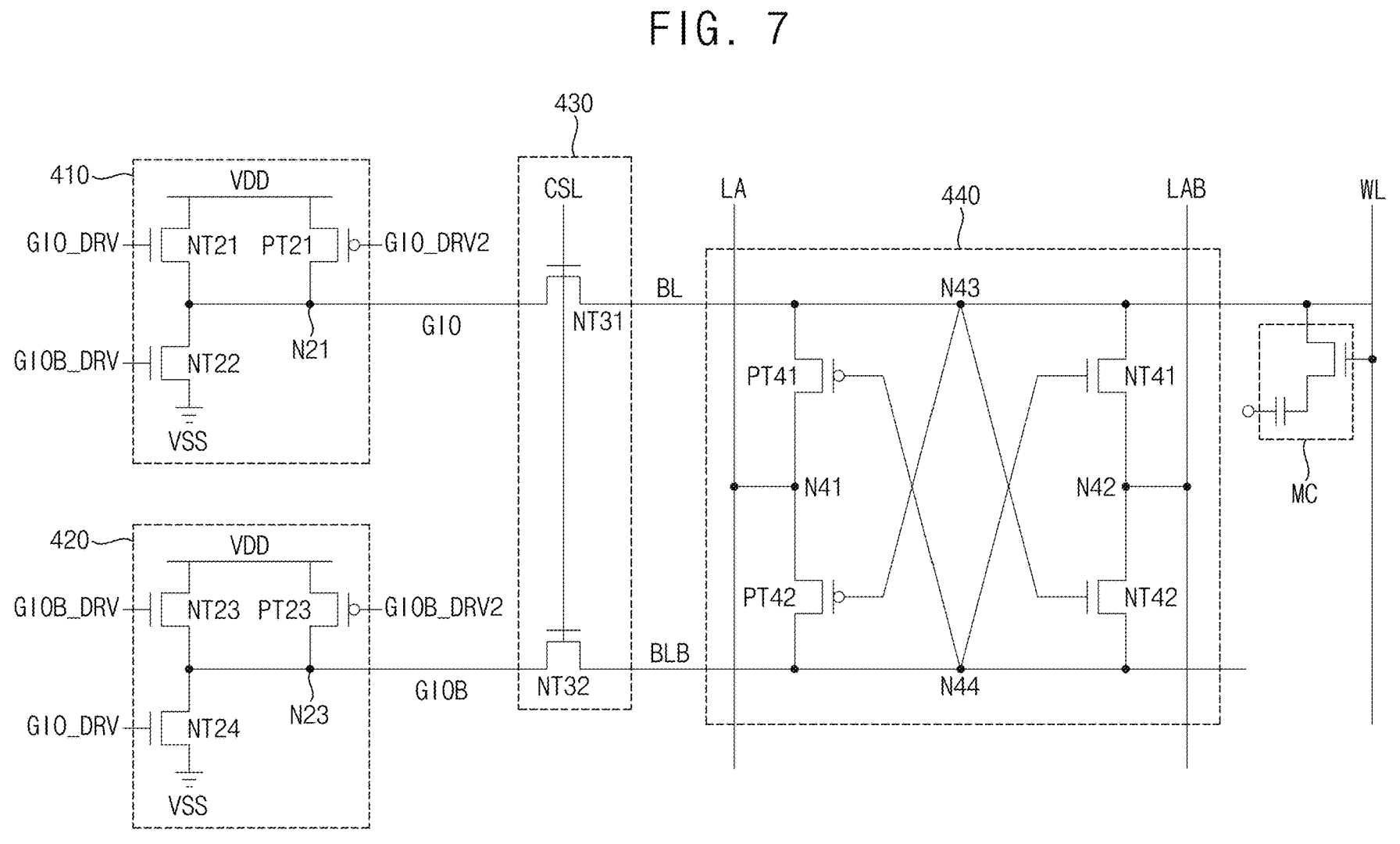
Figure 8:
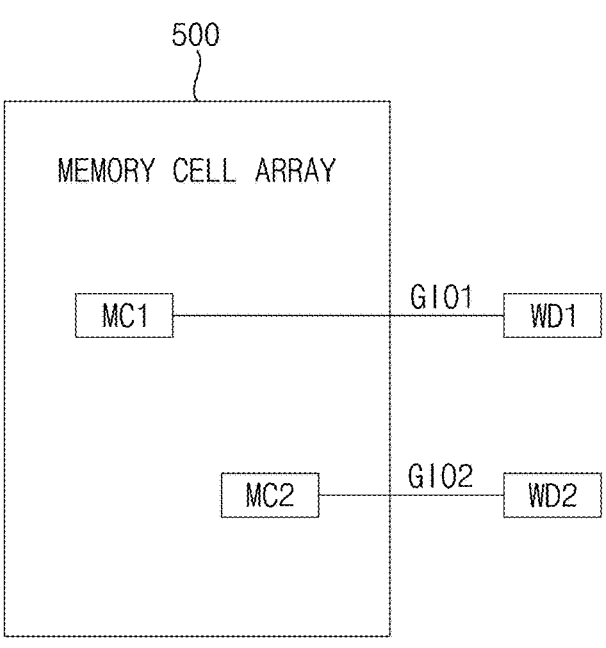

FIGS. 7 and 8 are diagrams illustrating examples where a write driver according to example embodiments is included in a semiconductor memory device according to example embodiments.

Referring to FIG. 7, write drivers 410 and 420, a column selection line driver 430 and a bitline sense amplifier 440 that are connected to one memory cell MC are illustrated.

The memory cell MC may be connected to the wordline WL and the bitline BL. For example, the memory cell MC may have a structure described with reference to FIG. 6.

Each of the write drivers 410 and 420 may be the write driver according to example embodiments described with reference to FIGS. 1 through 4B. For example, the write driver 410 may be connected to the global I/O line GIO, and may include transistors NT21, PT21 and NT22 that are connected to the power supply voltage VDD, an output node N21 and the ground voltage VSS. For example, the write driver 420 may be connected to the complementary global I/O line GIOB, and may include transistors NT23, PT23 and NT24 that are connected to the power supply voltage VDD, an output node N23 and the ground voltage VSS.

In the write driver 410, the transistors NT21, PT21 and NT22 and the output node N21 may correspond to the transistors NT11, PT11 and NT12 and the output terminal TOUT in FIG. 2, respectively, and control signals GIO_DRV, GIO_DRV2 and GIOB_DRV that are applied to the transistors NT21, PT21 and NT22 may correspond to the first pull-up control signal PUCS1, the second pull-up control signal PUCS2 and the pull-down control signal PDCS in FIGS. 1 and 2, respectively.

Similarly, in the write driver 420, the transistors NT23, PT23 and NT24 and the output node N23 may correspond to the transistors NT11, PT11 and NT12 and the output terminal TOUT in FIG. 2, respectively, and control signals GIOB_DRV, GIOB_DRV2 and GIO_DRV that are applied to the transistors NT23, PT23 and NT24 may correspond to the first pull-up control signal PUCS1, the second pull-up control signal PUCS2 and the pull-down control signal PDCS in FIGS. 1 and 2, respectively.

The global I/O line GIO and the complementary global I/O line GIOB may operate complementary to each other, and the write drivers 410 and 420 may operate complementary to each other. Therefore, the control signal GIO_DRV may be used as the first pull-up control signal PUCS1 and the control signal GIOB_DRV may be used as the pull-down control signal PDCS in the write driver 410, and the control signal GIOB_DRV may be used as the first pull-up control signal PUCS1 and the control signal GIO_DRV may be used as the pull-down control signal PDCS in the write driver 420.

The write drivers 410 and 420 may include different types of the transistors NT21, PT21, NT23 and PT23 that selectively perform the pull-up operation and operate based on the same power supply voltage VDD. Accordingly, the operating performance and efficiency may be improved or enhanced by reducing the power consumption and the total write time.

The column selection line driver 430 may control electrical connections of the global I/O line GIO and complementary global I/O line GIOB with the bitline BL and a complementary bitline BLB. For example, the column selection line driver 430 may include transistors NT31 and NT32.

The transistor NT31 may be connected between the global I/O line GIO and the bitline BL, and may include a gate electrode connected to a column selection line CSL. The transistor NT32 may be connected between the complementary global I/O line GIOB and the complementary bitline BLB, and may include a gate electrode connected to the column selection line CSL. When the transistors NT31 and NT32 are turned on in response to a column selection signal provided through the column selection line CSL, the global I/O line GIO and the complementary global I/O line GIOB may be electrically connected to the bitline BL and the complementary bitline BLB, respectively, and data output from the write drivers 410 and 420 may be transmitted to the bitline BL and the complementary bitline BLB and may be stored in the memory cell MC.

The bitline sense amplifier 440 may be connected to the bitline BL and the complementary bitline BLB, and may have a circuit structure for driving the bitline BL and the complementary bitline BLB. For example, the bitline sense amplifier 440 may include transistors PT41, PT42, NT41 and NT42 that are connected to a control line LA and a complementary control line LAB through nodes N41 and N42, and are connected to the bitline BL and the complementary bitline BLB through nodes N43 and N44.

The transistor PT41 may be connected between the nodes N43 and N41, and may include a gate electrode connected to the node N44. The transistor PT42 may be connected between the nodes N41 and N44, and may include a gate electrode connected to the node N43. The transistor NT41 may be connected between the nodes N43 and N42, and may include a gate electrode connected to the node N44. The transistor NT42 may be connected between the nodes N42 and N44, and may have a gate electrode connected to the node N43. Depending on operations of turning on and/or off the transistors PT41, PT42, NT41 and NT42 included in the bitline sense amplifier 440, various operations for the bitline BL and the complementary bitline BLB, such as a precharge operation, an offset cancellation operation, charge sharing operations, developing and sensing operations, etc., may be performed. For example, the power supply voltage VDD may be applied to the control line LA, and the ground voltage VSS may be applied to the complementary control line LAB.

In some example embodiments, each of the transistors PT41 and PT42 may be a PMOS transistor, and each of the transistors NT31, NT32, NT41 and NT42 may be an NMOS transistor.

However, example embodiments are not limited thereto, and the bitline sense amplifier is not limited to the structure illustrated in FIG. 7.

In some example embodiments, the memory cell MC may be included in the memory cell array 300 of FIG. 5, the bitline sense amplifier 440 may be included in the sense amplifier unit 285 of FIG. 5, and the write drivers 410 and 420 and the column selection line driver 430 may be included in the I/O gating circuit 290 of FIG. 5.

Although FIG. 7 illustrates the bitline sense amplifier 440, the column selection line driver 430 and the write drivers 410 and 420 that are connected to one memory cell MC, example embodiments are not limited thereto. For example, the semiconductor memory device may include a plurality of memory cells that are connected to a plurality of bitlines, may include a plurality of bitline sense amplifiers that are connected to the plurality of memory cells through the plurality of bitlines, may include a plurality of write drivers that are connected to the plurality of bitline sense amplifiers through a plurality of global I/O lines, and may include a plurality of column selection line drivers that control electrical connections between the plurality of bitlines and the plurality of global I/O lines.

In addition, although FIG. 7 illustrates that one global I/O line GIO is connected to one bitline BL, example embodiments are not limited thereto. For example, one global I/O line GIO may be simultaneously and/or sequentially connected to several bitlines by several column selection line drivers. For example, data output from the write drivers 410 and 420 may be simultaneously and/or sequentially stored in memory cells connected to the several bitlines, or may be simultaneously and/or sequentially stored in memory cells connected to one bitline and several wordlines.

Referring to FIG. 8, a memory cell array 500 may include a first memory cell MC1 and a second memory cell MC2 that are disposed or located in different regions. A first write driver WD1 may be connected to the first memory cell MC1 through a first global I/O line GIO1, and a second write driver WD2 may be connected to the second memory cell MC2 through the second global I/O line GIO2. Each of the first and second write drivers WD1 and WD2 may be the write driver according to example embodiments described with reference to FIGS. 1 through 4B.

In some example embodiments, a first distance between the first memory cell MC1 and the first write driver WD1 and a second distance between the second memory cell MC2 and the second write driver WD2 may be different from each other. For example, the first distance may be longer than the second distance, and the second distance may be shorter than the first distance. For example, the first distance may correspond to a length of the first global I/O line GIO1, and the second distance may correspond to a length of the second global I/O line GIO2. Although not illustrated in detail, bitlines, bitline sense amplifiers and column selection line drivers may be disposed between the memory cells MC1 and MC2 and the write drivers WD1 and WD2, as described with reference to FIG. 7.

In some example embodiments, a length of the time interval TD2 during which the first write driver WD1 performs the second pull-up operation using the second pull-up circuit 120, and a length of the time interval TD2 during which the second write driver WD2 performs the second pull-up operation using the second pull-up circuit 120 may be different from each other (e.g., may vary and/or may be changed), depending on the first distance between the first memory cell MC1 and the first write driver WD1 and the second distance between the second memory cell MC2 and the second write driver WD2.

In some example embodiments, as the distance between the memory cell and the write driver increases, the length of the time interval TD2 for performing the second pull-up operation may increase (e.g., the longer the distance between the memory cell and the write driver, the longer the time interval TD2 for performing the second pull-up operation may be). For example, the length of the time interval TD2 associated with the first write driver WD1 may be longer than the length of the time interval TD2 associated with the second write driver WD2.

In some example embodiments, as the distance between the memory cell and the write driver increases, the length of the time interval TD2 for performing the second pull-up operation may decrease. For example, the length of the time interval TD2 associated with the first write driver WD1 may be shorter than the length of the time interval TD2 associated with the second write driver WD2.

However, example embodiments are not limited thereto, and the length of the time interval TD2 may be variously determined according to example embodiments.

Figure 9:
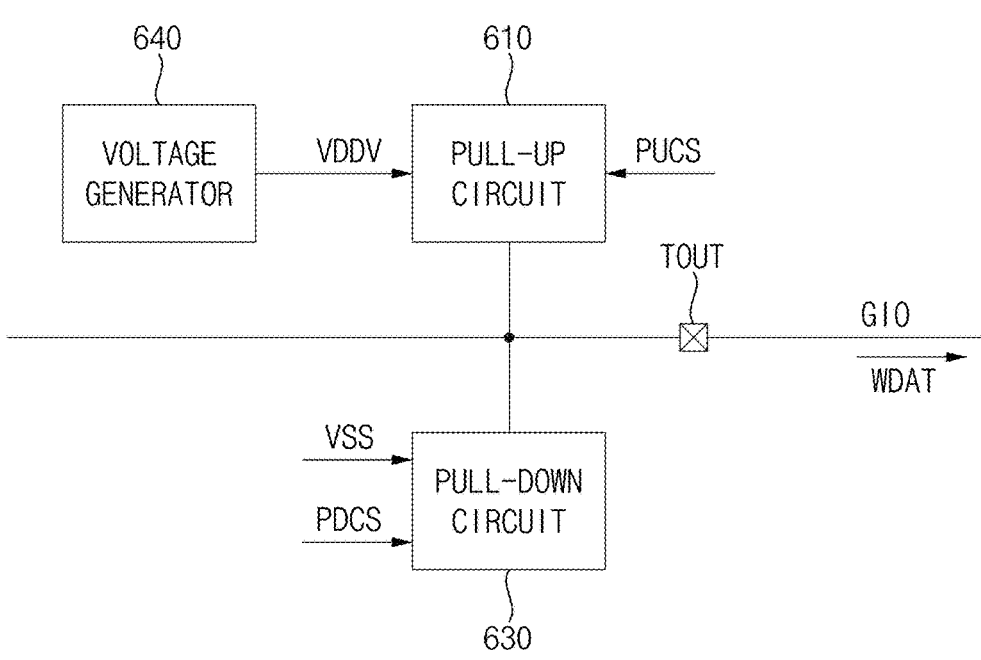
FIG. 9 is a block diagram illustrating a write driver according to example embodiments.

FIG. 9 is a block diagram illustrating a write driver according to example embodiments.

Referring to FIG. 9, a write driver 600 includes a pull-up circuit 610, a pull-down circuit 630 and a voltage generator 640. The descriptions repeated with or overlapping with descriptions of FIG. 1 will be omitted in the interest of brevity.

In some example embodiments, as described with reference to FIGS. 5, 7 and 8, the write driver 600 may be included in a semiconductor memory device, and may be used to perform a write operation on the semiconductor memory device. For example, each of the plurality of write drivers WD included in the I/O gating circuit 290 of FIG. 5 may be the write driver 600 of FIG. 9.

The pull-up circuit 610 is connected to an output terminal TOUT, and pulls up the output terminal TOUT based on a power supply voltage VDDV and a pull-up control signal PUCS. The pull-up circuit 610 may be similar to the first pull-up circuit 110 and the second pull-up circuit 120 in FIG. 1.

The pull-down circuit 630 is connected to the output terminal TOUT, and pulls down the output terminal TOUT based on a ground voltage VSS and a pull-down control signal PDCS. The pull-down circuit 630 may be substantially the same as the pull-down circuit 130 in FIG. 1.

The voltage generator 640 generates the power supply voltage VDDV. For example, unlike the power supply voltage VDD in FIG. 1 where the voltage level is fixed, the power supply voltage VDDV generated by the voltage generator 640 in FIG. 9 may be a variable voltage where a voltage level is changeable.

In some example embodiments, the write operation may be an operation in which a plurality of data that are consecutive data are stored in the semiconductor memory device at once. For example, in the entire time interval during which the plurality of data are provided, a first pull-up operation may be performed using the power supply voltage VDDV having a first power supply voltage level, during a certain time interval. For example, in the entire time interval during which the plurality of data are provided, a second pull-up operation may be performed using the power supply voltage VDDV having a second power supply voltage level different from the first power supply voltage level, during another certain time interval.

Figure 10A:
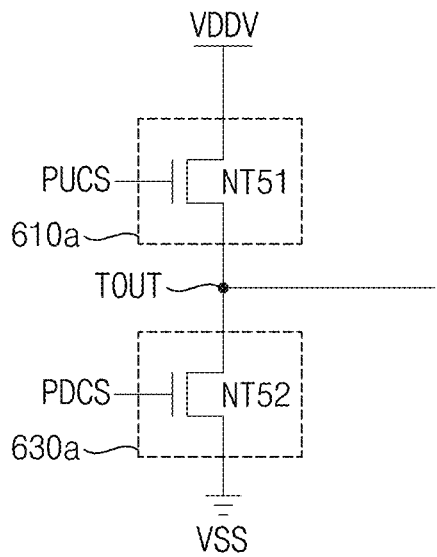
FIGS. 10A and 10B are circuit diagrams illustrating examples of a write driver of FIG. 9.
Figure 10B:
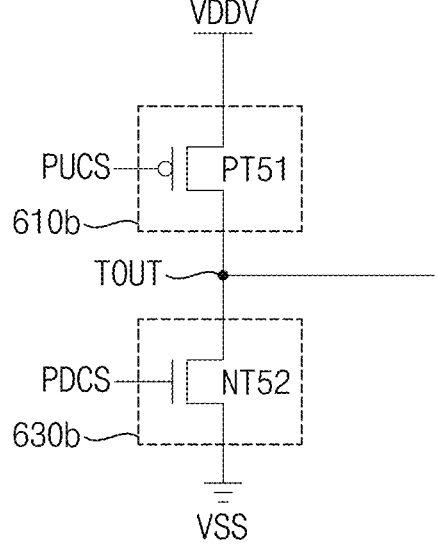

FIGS. 10A and 10B are circuit diagrams illustrating examples of a write driver of FIG. 9.

Referring to FIG. 10A, the write driver 600 includes a pull-up circuit 610a and a pull-down circuit 630a. The pull-up circuit 610a may include a first NMOS transistor NT51, and the pull-down circuit 630a may include a second NMOS transistor NT52.

The first NMOS transistor NT51 may be connected between a power supply terminal receiving the power supply voltage VDDV and the output terminal TOUT, and may include a gate electrode to which the pull-up control signal PUCS is applied. The second NMOS transistor NT52 may be connected between the output terminal TOUT and a ground terminal receiving the ground voltage VSS, and may include a gate electrode to which the pull-down control signal PDCS is applied.

Referring to FIG. 10B, the write driver 600 includes a pull-up circuit 610b and a pull-down circuit 630b. The pull-up circuit 610*b* may include a first PMOS transistor PT51, and the pull-down circuit 630*b* may include a second NMOS transistor NT52.

The first PMOS transistor PT51 may be connected between the power supply terminal receiving the power supply voltage VDDV and the output terminal TOUT, and may include a gate electrode to which the pull-up control signal PUCS is applied. The second NMOS transistor NT52 may be substantially the same as that described with reference to FIG. 10A.

Figure 11:
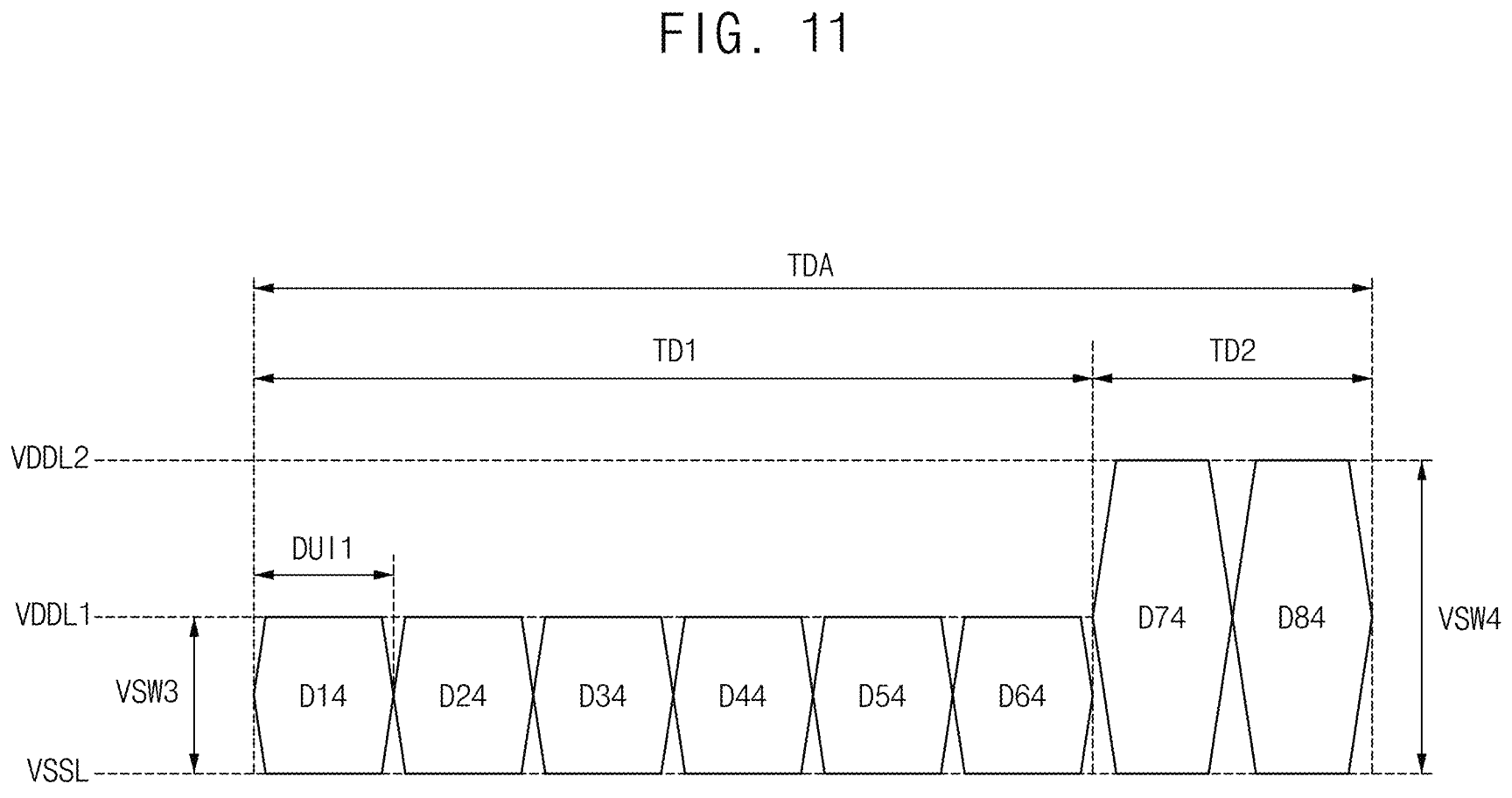

FIG. 11 is a diagram for describing an operation of a write driver according to example embodiments.

Referring to FIG. 11, an operation of providing data using the write driver 600 according to example embodiments is illustrated. For example, FIG. 11 illustrates the voltage at the output terminal TOUT. The descriptions repeated with or overlapping with descriptions of FIGS. 3, 4A and 4B will be omitted in the interest of brevity.

The write data that is the target of the write operation may include a plurality of data D14, D24, D34, D44, D54, D64, D74 and D84 that are consecutive data.

During the first time interval TD1 of the entire time interval TDA during which the plurality of data D14, D24, D34, D44, D54, D64, D74 and D84 are provided, the power supply voltage VDDV may have a first power supply voltage level VDDL1, and the voltage at the output terminal TOUT (e.g., the voltage of the global I/O line GIO) may have a third swing width VSW3.

During the second time interval TD2 subsequent to the first time interval TD1 of the entire time interval TDA, the power supply voltage VDDV may have a second power voltage level VDDL2 higher than the first power voltage level VDDL1, and the voltage at the output terminal TOUT (e.g., the voltage of the global I/O line GIO) may have a fourth swing width VSW4 that is greater than the third swing width VSW3.

In both the first time interval TD1 and the second time interval TD2, the pull-up control signal PUCS and the pull-down control signal PDCS may be complementary activated and deactivated, and thus the pull-up circuit 610 and pull-down circuit 630 may be complementary enabled and disabled.

As described with reference to FIGS. 1 through 4B, when the write driver includes different types of the transistors NT11 and PT11 that selectively perform the pull-up operation and operate based on the same power supply voltage VDD, the power consumption may be reduced by performing the small-swing operation in the first time interval TD1, and the total write time may be reduced by performing the full-swing operation in the second time interval TD2.

In addition, as described with reference to FIGS. 9 through 11, even when the write driver includes one transistor NT51 or PT51 that operates based on the power supply voltage VDDV having the variable voltage level, the voltage level of the power supply voltage VDDV may be set differently in the first and second time intervals TD1 and TD2. Therefore, the power consumption may be reduced by performing the small-swing operation in the first time interval TD1, and the total write time may be reduced by performing the full-swing operation in the second time interval TD2.

FIG. 12 is a flowchart illustrating a method of operating a write driver according to example embodiments.

Referring to FIGS. 3 and 12, in a method of operating a write driver according to example embodiments, a write operation is performed on a semiconductor memory device including the write driver, and the write operation is an operation in which the plurality of data D11, D21, D31, D41, D51, D61, D71 and D81 that are consecutive data are stored in the semiconductor memory device at once. During the first time interval TD1 of the entire time interval TDA in which the plurality of data D11, D21, D31, D41, D51, D61, D71 and D81 are provided, the first data D11, D21, D31, D41, D51 and D61 among the plurality of data D11, D21, D31, D41, D51, D61, D71 and D81 are provided such that the first data D11, D21, D31, D41, D51 and D61 have the first swing width VSW1 (operation S100). During the second time interval TD2 subsequent to the first time interval TD1 of the entire time interval TDA, the second data D71 and D81 among the plurality of data D11, D21, D31, D41, D51, D61, D71 and D81 are provided such that the second data D71 and D81 have the second swing width VSW2 greater than the first swing width VSW1 (operation S200).

In some example embodiments, operations S100 and S200 may be performed using the write driver according to example embodiments described with reference to FIGS. 1 through 4B. In some example embodiments, operations S100 and S200 may be performed using the write driver according to example embodiments described with reference to FIGS. 9 through 11.

As will be appreciated by those skilled in the art, example embodiments may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

FIG. 13 is a block diagram illustrating a memory system according to example embodiments.

Referring to FIG. 13, a memory system 10 includes a memory controller 20 and a semiconductor memory device 40. The memory system 10 may further include a plurality of signal lines 30 that electrically connect the memory controller 20 with the semiconductor memory device 40.

The semiconductor memory device 40 is controlled by the memory controller 20. For example, based on requests from a host (not illustrated), the memory controller 20 may store (e.g., write or program) data into the semiconductor memory device 40, or may retrieve (e.g., read or sense) data from the semiconductor memory device 40.

The semiconductor memory device 40 may include a hybrid write driver 50. The hybrid write driver 50 may be the write driver according to example embodiments described with reference to FIGS. 1 through 4B. For example, the hybrid write driver 50 may include the first and second pull-up circuits, which selectively perform the pull-up operation and include different types of the transistors operating based on the same power supply voltage. Accordingly, the operating performance and efficiency may be improved or enhanced by reducing the power consumption and the total write time.

The plurality of signal lines 30 may include control lines, command lines, address lines, data input/output (I/O) lines and power lines. The memory controller 20 may transmit a command CMD, an address ADDR and a control signal CTRL to the semiconductor memory device 40 via the command lines, the address lines and the control lines, may exchange data DAT with the semiconductor memory device 40 via the data I/O lines, and may transmit a power supply voltage PWR to the semiconductor memory device 40 via the power lines. Although not illustrated in FIG. 13, the plurality of signal lines 30 may further include data strobe signal (DQS) lines for transmitting a DQS signal.

Figure 14:
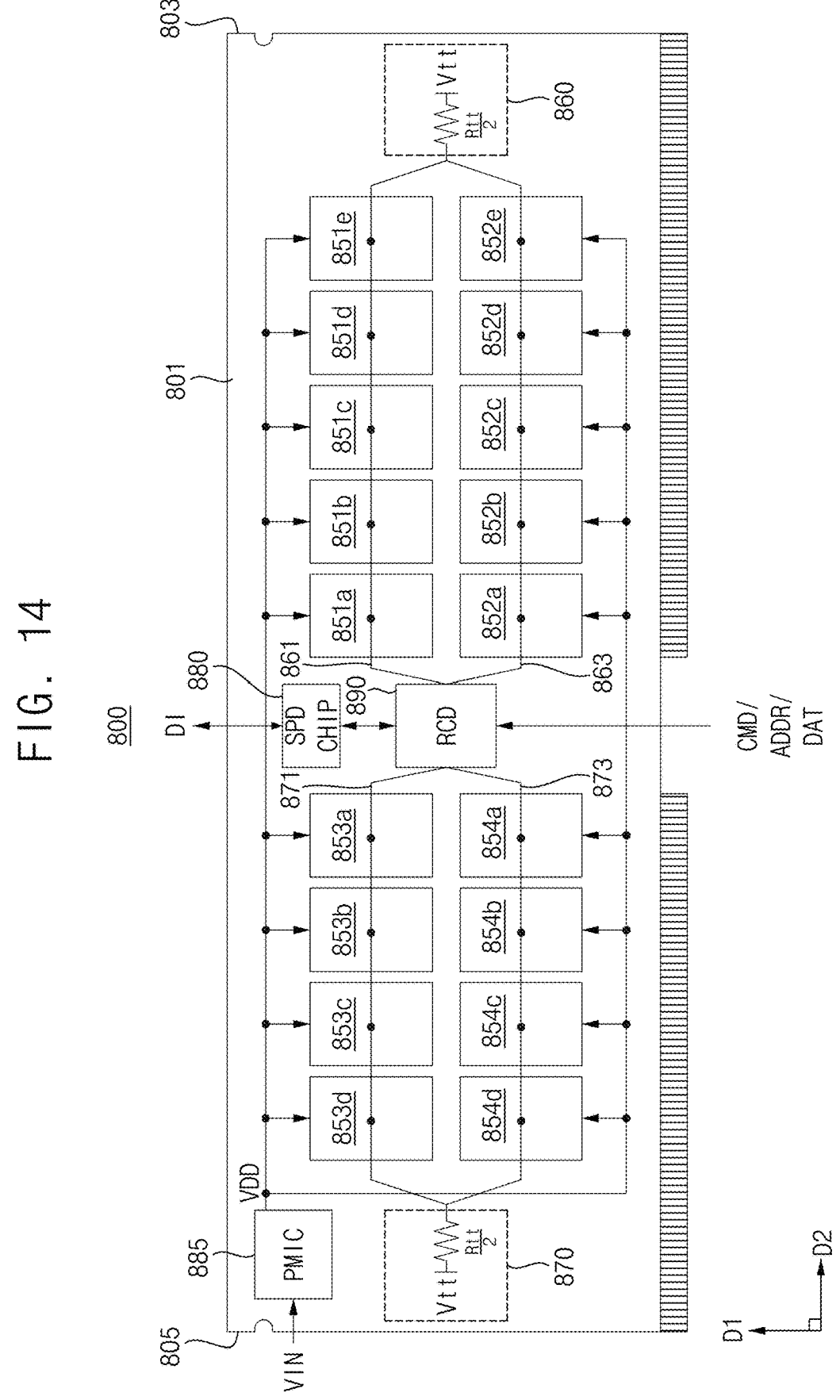
FIG. 14 is a block diagram illustrating an example of a memory module that may be employed to a memory system according to example embodiments.

FIG. 14 is a block diagram illustrating an example of a memory module that may be employed to a memory system according to example embodiments.

Referring to FIG. 14, a memory module 800 may include a buffer chip 890 (e.g., a registered clock driver; RCD) disposed in or mounted on a circuit board 801, a plurality of semiconductor memory devices 851a, 851b, 851c, 851d, 851e, 852a, 852b, 852c, 852d, 852e, 853a, 853b, 853c, 853d, 854a, 854b, 854c and 854d, module resistance units 860 and 870, a serial present detection (SPD) chip 880, and/or a power management integrated circuit (PMIC) 885.

The buffer chip 890 may control the semiconductor memory devices 851a to 851e, 852a to 852e, 853a to 853d and 854a to 854d and the PMIC 885, under a control of a memory controller (e.g., the memory controller 20 in FIG. 13). For example, the buffer chip 890 may receive a command CMD, an address ADDR and data DAT from the memory controller.

The SPD chip 880 may be a programmable read only memory (PROM) (e.g., an electrically erasable PROM (EE-PROM)). The SPD chip 880 may include initial information and/or device information DI of the memory module 800. In some example embodiments, the SPD chip 880 may include the initial information and/or the device information DI such as a module form, a module configuration, a storage capacity, a module type, an execution environment, and/or the like of the memory module 800.

When a memory system including the memory module 800 is booted up, the memory controller may read the device information DI from the SPD chip 880, and may recognize the memory module 800 based on the device information DI. The memory controller may control the memory module 800 based on the device information DI from the SPD chip 880. For example, the memory controller may recognize a type of the semiconductor memory devices 851a to 851e, 852a to 852e, 853a to 853d and 854a to 854d included in the memory module 800 based on the device information DI from the SPD chip 880.

Here, the circuit board 801 which is a printed circuit board (PCB) may extend in a second direction D2, perpendicular to a first direction D1, between a first edge portion 803 and a second edge portion 805. The first edge portion 803 and the second edge portion 805 may extend in the first direction D1. The buffer chip 890 may be disposed on a center of the circuit board 801. The plurality of semiconductor memory devices 851a to 851e, 852a to 852e, 853a to 853d and 854a to 854d may be arranged in a plurality of rows between the buffer chip 890 and the first edge portion 803, and between the buffer chip 890 and the second edge portion 805. In some example embodiments, operations described herein as being performed by the buffer chip 890 may be performed by processing circuitry.

In this example, the semiconductor memory devices 851a to 851e and 852a to 852e may be arranged along a plurality of rows between the buffer chip 890 and the first edge portion 803. The semiconductor memory devices 853a to 853d and 854a to 854d may be arranged along a plurality of rows between the buffer chip 890 and the second edge portion 805. For example, the semiconductor memory devices 851a to 851d, 852a to 852d, 853a to 853d and 854a to 854d may be data chips storing normal data, and the semiconductor memory devices 851e and 852e may be parity chips storing parity data or error correction code (ECC) data.

The buffer chip 890 may provide a command/address signal (e.g., CA) to the semiconductor memory devices 851a to 851e through a command/address transmission line 861, and may provide a command/address signal to the semiconductor memory devices 852a to 852e through a command/address transmission line 863. In addition, the buffer chip 890 may provide a command/address signal to the semiconductor memory devices 853a to 853d through a command/address transmission line 871, and may provide a command/address signal to the semiconductor memory devices 854a to 854d through a command/address transmission line 873.

The command/address transmission lines 861 and 863 may be connected in common to the module resistance unit 860 disposed to be adjacent to the first edge portion 803, and the command/address transmission lines 871 and 873 may be connected in common to the module resistance unit 870 disposed to be adjacent to the second edge portion 805. Each of the module resistance units 860 and 870 may include a termination resistor Rtt/2 connected to a termination voltage Vtt.

The SPD chip 880 may be disposed to be adjacent to the buffer chip 890, and the PMIC 885 may be disposed between the semiconductor memory device 853d and the second edge portion 805. The PMIC 885 may generate a power supply voltage VDD based on an input voltage VIN, and may provide a power supply voltage VDD to the semiconductor memory devices 851a to 851e, 852a to 852e, 853a to 853d and 854a to 854d.

In some example embodiments, each of the semiconductor memory devices 851a to 851e, 852a to 852e, 853a to 853d and 854a to 854d may be a DRAM device, and may include the write driver according to example embodiments.

Figure 15:
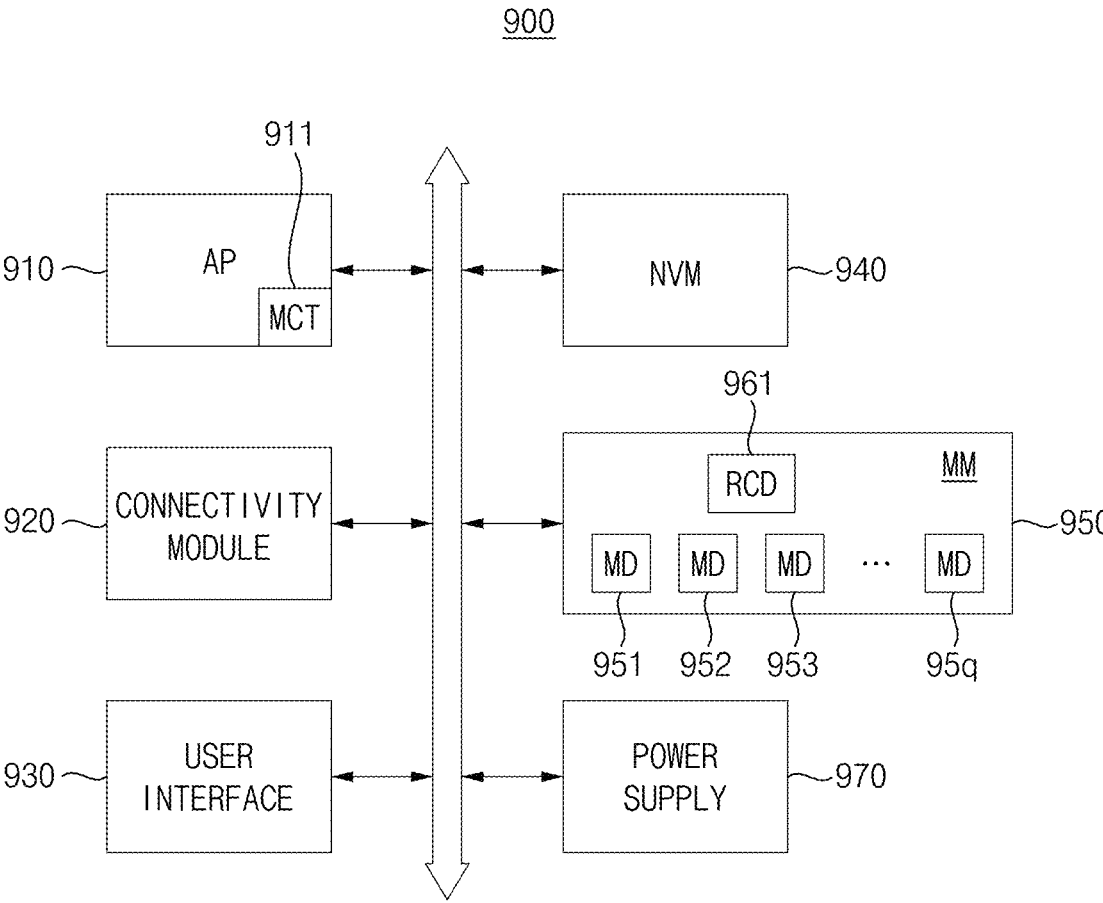
FIG. 15 is a block diagram illustrating an electronic system including a memory module according to example embodiments.

FIG. 15 is a block diagram illustrating an electronic system including a memory module according to example embodiments.

Referring to FIG. 15, an electronic system 900 may include an application processor (AP) 910, a connectivity module 920, a user interface 930, a nonvolatile memory device (NVM) 940, a memory module (MM) 950 such as a dual in-line memory module (DIMM), and/or a power supply 970. For example, the electronic system 900 may be a mobile system.

The application processor 910 may include a memory controller 911. The application processor 910 may execute applications, such as at least one of a web browser, a game application, a video player, etc. The connectivity module 920 may perform wired and/or wireless communication with an external device.

The memory module 950 may store data processed by the application processor 910 and/or operate as a working memory. The memory module 950 may include a plurality of semiconductor memory devices (MD) 951, 952, 953, . . . , 95q (where q is a positive integer greater than three), and/or a buffer chip (RCD) 961. The memory module 950 may be the memory module 800 of FIG. 14.

In some example embodiments, each of the semiconductor memory devices 951 to 95q may be a DRAM device, and may include the write driver according to example embodiments.

The nonvolatile memory device 940 may store a boot image for booting the electronic system 900. The user interface 930 may include at least one input device, such as a keypad, a touch screen, etc., and at least one output device, such as a speaker, a display device, etc. The power supply 970 may supply an operating voltage to the electronic system 900.

The electronic system 900 or components of the electronic system 900 may be mounted using various types of packages.

The example embodiments may be applied to various electronic devices and systems that include the semiconductor memory devices. For example, the example embodiments may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A write driver configured to perform a write operation on a semiconductor memory device, the write driver comprising:
    a first pull-up circuit connected to an output terminal, the first pull-up circuit configured to pull up a voltage level of the output terminal based on a power supply voltage and a first pull-up control signal;
    a second pull-up circuit connected to the output terminal, the second pull-up circuit configured to pull up the voltage level of the output terminal based on the power supply voltage and a second pull-up control signal; and
    a pull-down circuit connected to the output terminal, the pull-down circuit configured to pull down the voltage level of the output terminal based on a ground voltage and a pull-down control signal, and
    wherein a first pull-up operation for pulling up the voltage level of the output terminal using the first pull-up circuit, and a second pull-up operation for pulling up the voltage level of the output terminal using the second pull-up circuit are selectively performed,
    wherein the write driver is configured to disable the second pull-up circuit while the first pull-up circuit is enabled to perform the first pull-up operation and is further configured to disable the first pull-up circuit while the second pull-up circuit is enabled to perform the second pull-up operation.

2. The write driver of claim 1, wherein a first swing width of a voltage at the output terminal during the first pull-up operation is smaller than a second swing width of a voltage at the output terminal during the second pull-up operation.

3. The write driver of claim 1, wherein the first pull-up circuit and the second pull-up circuit include different types of transistors.

4. The write driver of claim 3, wherein the first pull-up circuit includes:
    a first n-type metal oxide semiconductor (NMOS) transistor connected between a power supply terminal receiving the power supply voltage and the output terminal, the first NMOS transistor including a first NMOS gate electrode to which the first pull-up control signal is applied.

5. The write driver of claim 4, wherein the second pull-up circuit includes:
    a p-type metal oxide semiconductor (PMOS) transistor connected between the power supply terminal and the output terminal, the PMOS transistor including a PMOS gate electrode to which the second pull-up control signal is applied.

6. The write driver of claim 5, wherein the first NMOS transistor and the PMOS transistor are configured to operate based on the power supply voltage that is maintained at the same voltage.

7. The write driver of claim 4, wherein the first pull-up circuit and the pull-down circuit include the same type of transistors.

8. The write driver of claim 7, wherein the pull-down circuit includes:
    a second NMOS transistor connected between the output terminal and a ground terminal receiving the ground voltage, the second NMOS transistor including a second NMOS gate electrode to which the pull-down control signal is applied.

9. The write driver of claim 1, wherein the write operation is an operation in which a plurality of data that are consecutive data are stored in the semiconductor memory device at once.

10. The write driver of claim 9, wherein, in a time interval during which the plurality of data are provided, the first pull-up operation is performed during a first portion of the time interval, and the second pull-up operation is performed during a second portion of the time interval subsequent to the first portion of the time interval.

11. The write driver of claim 10, wherein a length of the second portion of the time interval is changeable.

12. The write driver of claim 10, wherein, among the plurality of data, a number of data provided during the second portion of the time interval is changeable.

13. The write driver of claim 10, wherein the pull-down circuit is configured to perform a pull-down operation for pulling down the voltage level of the output terminal during the first portion of the time interval and the second portion of the time interval.

14. The write driver of claim 10, wherein the first portion of the time interval and the second portion of the time interval do not overlap with each other.

15. A semiconductor memory device comprising:
    a memory cell array including a plurality of memory cells connected to a plurality of wordlines and a plurality of bitlines;
    a plurality of bitline sense amplifiers connected to the memory cell array through the plurality of bitlines; and
    a plurality of write drivers connected to the plurality of bitline sense amplifiers through a plurality of global input/output (I/O) lines, the plurality of write drivers configured to perform a write operation on the memory cell array,
    wherein each of the plurality of write drivers includes:

a first pull-up circuit connected to an output terminal, the first pull-up circuit configured to pull up a voltage level of the output terminal based on a power supply voltage and a first pull-up control signal;

a second pull-up circuit connected to the output terminal, the second pull-up circuit configured to pull up the voltage level of the output terminal based on the power supply voltage and a second pull-up control signal; and a pull-down circuit connected to the output terminal, the pull-down circuit configured to pull down the voltage level of the output terminal based on a ground voltage and a pull-down control signal, and wherein a first pull-up operation for pulling up the voltage level of the output terminal using the first pull-up circuit, and a second pull-up operation for pulling up the voltage level of the output terminal using the second pull-up circuit are selectively performed, wherein the plurality of memory cells include a first memory cell and a second memory cell, wherein the plurality of write drivers include a first write driver connected to the first memory cell, and a second write driver connected to the second memory cell, and wherein a length of a first time interval during which the first write driver performs the second pull-up operation and a length of a second time interval during which the second write driver performs the second pull-up operation are different from each other, depending on a first distance between the first memory cell and the first write driver and a second distance between the second memory cell and the second write driver.

16. The semiconductor memory device of claim 15, further comprising:

a plurality of column selection line drivers configured to control electrical connections between the plurality of bitlines and the plurality of global I/O lines, and wherein output terminals of the plurality of write drivers are connected to the plurality of global I/O lines.

17. The semiconductor memory device of claim 15, wherein the semiconductor memory device is a dynamic random access memory (DRAM) device.

18. A write driver configured to perform a write operation on a semiconductor memory device, the write driver comprising:

a first n-type metal oxide semiconductor (NMOS) transistor connected between a power supply terminal receiving a power supply voltage and an output terminal connected to a global input/output (I/O) line, the first NMOS transistor including a gate electrode to which a first pull-up control signal is applied;

a p-type metal oxide semiconductor (PMOS) transistor connected between the power supply terminal and the output terminal, the PMOS transistor including a gate electrode to which a second pull-up control signal is applied;

a second NMOS transistor connected between the output terminal and a ground terminal receiving a ground voltage, the second NMOS transistor including a gate electrode to which a pull-down control signal is applied, wherein the write operation is an operation in which a plurality of data that are consecutive data are stored in the semiconductor memory device at once, wherein, in a time interval during which the plurality of data are provided, a first pull-up operation for pulling up a voltage level of the output terminal based on the power supply voltage and the first pull-up control signal is performed during a first portion of the time interval, a second pull-up operation for pulling up the voltage level of the output terminal based on the power supply voltage and the second pull-up control signal is performed during a second portion of the time interval subsequent to the first portion of the time interval, and a pull-down operation for pulling down the voltage level of the output terminal based on the ground voltage and the pull-down control signal is performed during the first portion of the time interval and the second portion of the time interval, wherein, in the first portion of the time interval, the PMOS transistor is disabled, and a voltage at the output terminal has a first swing width based on the first pull-up operation and the pull-down operation, and wherein, in the second portion of the time interval, the first NMOS transistor is disabled, and the voltage at the output terminal has a second swing width greater than the first swing width based on the second pull-up operation and the pull-down operation.

* * * * *